United States Patent
Asahara et al.

(10) Patent No.: US 6,631,174 B1
(45) Date of Patent: Oct. 7, 2003

(54) AUTOMATIC FREQUENCY CONTROL APPARATUS

(75) Inventors: Takashi Asahara, Tokyo (JP); Toshiharu Kojima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/374,261

(22) Filed: Aug. 16, 1999

(30) Foreign Application Priority Data

Jun. 9, 1999 (JP) .................................. PCT/JP99/03079

(51) Int. Cl.$^7$ .......................... H04L 27/06; H04L 27/38
(52) U.S. Cl. ...................... 375/344; 375/324; 375/326
(58) Field of Search ................................ 375/344, 324, 375/326; 455/126; 348/640

(56) References Cited

U.S. PATENT DOCUMENTS

| | | | | |
|---|---|---|---|---|
| 5,193,224 A | * | 3/1993 | McNicol et al. | 455/126 |
| 5,345,311 A | * | 9/1994 | Adach | 348/640 |
| 5,757,864 A | * | 5/1998 | Petranovich et al. | 375/344 |
| 5,991,342 A | * | 11/1999 | Herbig | 375/326 |
| 6,452,983 B1 | * | 9/2002 | Asahara et al. | 375/324 |

FOREIGN PATENT DOCUMENTS

JP        993302        4/1997

OTHER PUBLICATIONS

Kato, S., et al., "Frequency Offset Compensation Method for QAM in Land Mobile Radio Communications", Collection of Reports, Institute of Electronics, Information and Communication Engineers,(B–II), J74–B–II, No. 9, Sep. 1991, pp. 493–496.

* cited by examiner

Primary Examiner—Stephen Chin
Assistant Examiner—Edith Yeh
(74) Attorney, Agent, or Firm—Rothwell, Figg, Ernst & Manbeck

(57) ABSTRACT

A transmitting side periodically inserts a known signal consisting of successive $N_P$ symbols into an information signal consisting of ($N_F$–$N_P$) symbols and transmits the $N_F$ symbol signal. The receiving side receives the $N_F$ symbol signal, and automatically controls a frequency by estimating a frequency deviation from the incoming signal. More specifically, the receiving side outputs I and Q-channel analog baseband signals from the received incoming signal as well as from a sinusoidal signal outputted from an oscillator, and converts the analog baseband signals to the digital baseband signals. Then a phase difference for one symbol cycle is estimated from the digital baseband signals, integration processing is executed by iterative addition of the estimated values, and the frequency deviation is eliminated from the digital baseband signals using a result of the processing for integration.

16 Claims, 19 Drawing Sheets

AUTOMATIC FREQUENCY CONTROL APPARATUS

FIELD OF THE INVENTION

The present invention relates to an automatic frequency control apparatus capable of improving transmission quality in the digital modulation/demodulation system employed in satellite communications, mobile communications, and mobile satellite communications. More specifically this invention relates to an automatic frequency control apparatus capable of improving receiver performance by periodically inserting a known signal into an outgoing signal and removing a frequency deviation generated in the known signal during transaction between the transmitter and the receiver.

BACKGROUND OF THE INVENTION

In recent years, in the fields of satellite communications, mobile communications, and mobile satellite communications, research is actively being performed on digital modulation/demodulation. Especially, in the mobile communications, an incoming signal is received which is generally subjected to severe fading, so that now feasibility of various types of demodulation system enabling stable operations even in the fading environment are being examined. Under such circumstances, a technology in which a known signal to be utilized for measuring a distortion due to fading in a channel is periodically inserted into the outgoing signal, the distortion due to fading is estimated and compensated from the known signal has been gathering hot attentions as a technology enabling coherent detection even in the fading environment. When performing quasi-coherent detection using such a system, it is required to estimate and compensate the distortion due to fading with high precision, and further the frequency deviation between the outgoing carrier wave and a reference signal for performing quasi-coherent detection in a receiver should be small.

However, when performing coherent detection in the fading environment, if stability and precision of a frequency of an oscillator in a transmitter/receiver are not sufficient, it is impossible to estimate and compensate the distortion due to fading with high precision unless some other specific processing is disadvantageously executed.

In the field of mobile communications, signal transaction is carried out between two mobile stations or between a stationary station and a mobile station, so that, when two stations are relatively moving, a frequency deviation occurs in the transmitted electric wave due to the Doppler effect. Even if the precision of the oscillator in the transmitter or the receiver is high, a frequency deviation disadvantageously occurs between the outgoing carrier wave and a reference signal for performing quasi-coherent detection in a receiver.

As a technology for solving the problems as described above, there is, for instance, a technology described in "Frequency Offset Compensation Method for QAM in Land Mobile Radio Communications" (Kato, Sasaoka, Collection of reports, Institute of Electronics, Information and Communication Engineers (B-II), J74-B-II, No.9, pp493–496 (1991–9)).

FIG. 19 is a view showing configuration of a conventional type of automatic frequency control apparatus described in the above document. In FIG. 19, designated at the reference numeral 80 is a known-signal distortion detecting section, designated at 89 is a inter-known-signal phase difference estimating section, designated at 890 is a inter-known-signal phase difference computing section, designated at 891 is a averaging section, and designated at 85 is a inter-one-symbol phase difference computing section.

Operations of the conventional type of automatic frequency control apparatus as described above are explained below.

FIG. 20 is a view showing a format of an incoming signal when a one-symbol known signal is periodically inserted in the signal. For instance, a transmitter transmits a signal formatted by periodically inserting a one-symbol known signal (herein, a known pilot signal) into a ($N_F$-1) symbol data signal as shown in FIG. 20. It is assumed herein that the one-symbol pilot signal is inserted at a time $t=kN_F T_S$. Herein k indicates a natural number, $N_F$ indicates an interval at which the pilot signal is to be inserted (insertion interval), and $T_S$ indicates a symbol duration.

When such a signal is received by the known-signal distortion detecting section 80, the inter-known-signal phase difference computing section 890 in the inter-known-signal phase difference estimating section 89 computes a phase deviation between the pilot signals inserted at an interval of $N_F$. Further, the averaging section 891 calculates the average of the phase deviations outputted from the inter-known-signal phase difference computing section 890 and outputs the average $<\theta(kN_F)>$ of the phase deviations $\theta(kN_F)$.

Then the inter-one-symbol phase difference computing section 85 computes a phase rotation $\theta_S$ in one-symbol as expressed, for instance, by the equation (1) from the average of phase deviations.

$$\theta_S = \frac{\langle \theta(kN_F) \rangle}{N_F} \quad (1)$$

Then the inter-one-symbol phase difference computing section 85 executes integration processing by means of iterative addition of one-symbol cycles as expressed, for instance, by the equation (2) by using the computed phase rotation $\theta_S$.

$$\theta(kN_F+i)=\theta(kN_F+i-1)+\theta_S \quad (2)$$

Finally the inter-one-symbol phase difference computing section 85 rotates the phase of the incoming signal to remove the frequency deviation. Namely, the inter-one-symbol phase difference computing section 85 rotates the phase for each one-symbol, as expressed by the equation (3), for a digital baseband signal $r(kN_F+i)$ in the I channel and Q channel to remove the frequency deviation.

$$r_R(kN_F+i)=r(kN_F+i)\exp[-j\theta(kN_F+i)], \ 0 \leq i \leq N_F-1 \quad (3)$$

Assuming that the modulating symbol rate is $R_S$ (symbol/s), a frequency deviation detection range $-f_{DET}$[Hz] to $f_{DET}$[Hz] in the inter-known-signal phase difference estimating section 89 $-f_{DET}$[Hz] to $f_{DET}$[Hz] is as expressed by equation (4):

$$f_{DET} = \frac{R_S}{2N_F} \quad (4)$$

As understood from the equation (4), by reducing the insertion interval $N_F$ the range of detectable frequency deviation can be made wider. However, when it is considered that a function of the inter-known-signal phase difference estimating section 89 is equivalent to that of a filter, when the range of frequency deviation detection is made wider by reducing the insertion interval $N_F$, the same effect as that provided when a frequency band of a filter is equivalently extended is provided. Namely, an estimation error for a frequency deviation due to noises or the like becomes larger, and precision in estimating a frequency deviation is degraded. Accordingly, to improve the precision in estimating a frequency deviation, it is better that the insertion interval $N_F$ is large.

In the automatic frequency control apparatus as described in the above mentioned document, however, the amount of phase rotation due to a frequency deviation is computed by using only the known signals inserted at an insertion interval of $N_F$, so that it is necessary to increase the insertion interval $N_F$ in order to improve the precision in estimation of a frequency deviation. Due to this fact, the detection range of frequency deviation becomes disadvantageously narrower. On the other hand, if the insertion interval $N_F$ is decreased in order to widen the detection range of frequency deviation, the frame efficiency becomes lower, and there occurs a new problem that the precision in estimation of the frequency deviation is degraded.

Further, in the conventional type of automatic frequency control apparatus, a distortion of a channel is detected by using only a one-symbol known signal, so that a period of time required for high precision in estimating a frequency becomes longer in an environment with a low C/N (carrier to noise power ratio) and the tracking performance to time-dependent fluctuation in a frequency deviation caused by the Doppler effect or the like becomes disadvantageously lower.

Further, when a direct wave and a multi-path wave coexist like in the fading environment, a frequency deviation of the direct wave can not be estimated with high precision because of effects by the multi-path wave, and frequency control over the direct wave becomes disadvantageously difficult.

SUMMARY OF THE INVENTION

The present invention was made under the circumstances as described above, and it is an object of the present invention to provide an automatic frequency control apparatus which enables simultaneous realization of a wide detection range for a frequency deviation and high precision in estimation of a frequency deviation as well as estimation of a frequency deviation within a short period of time even in an environment with a low C/N ratio. It is also an object of the present invention to provide an automatic frequency control apparatus which allows estimation of a frequency deviation in a direct wave with high precision and frequency control over the direct wave even in a situation where a multi-path wave and a direct wave coexist like in the fading environment.

In the present invention, a frequency deviation in one symbol is computed according to the frequency deviation in the first period estimated by the first phase difference estimating unit and the frequency deviation in the second period estimated by the second phase difference estimating unit. Therefore, a wide detection range for a frequency deviation in one of the phase difference estimating units and high precision in estimation of a frequency deviation in the other phase difference estimating unit can simultaneously be realized. In addition, with the present invention, a frequency deviation of a direct wave can be estimated with higher precision than that of the conventional system in a situation where a multi-path wave and a direct wave coexist like in the Rician fading environment, and further accurate frequency control can be provided to a direct wave. The phase difference herein includes a meaning of information for a phase difference represented by a vector other than an ordinary phase difference $\theta$.

In the present invention, the distortion averaging unit executes the average processing, therefore an estimation error for phase fluctuation due to fading as well as for a frequency deviation affected by noise or the like can be reduced, and at the same time a frequency deviation between a transmitter and a receiver and frequency fluctuation caused due to the Doppler effect can be estimated with high precision.

In the present invention, the first phase difference estimating unit located in the previous stage of the second phase difference estimating unit estimates a frequency deviation in N1, and after the frequency deviation is removed according to a result of the estimation, the second phase difference estimating unit further estimates a frequency deviation in N2, and the results of estimation of frequency deviations in both the phase difference estimating units are synthesized. Therefore, a wide detection range for a frequency deviation in the first phase difference estimating unit and high precision in estimation of a frequency deviation in the second phase difference estimating unit can simultaneously be realized. In addition, with the present invention, a frequency deviation of a direct wave can be estimated with higher precision than that of the conventional system in a situation where a multi-path wave and a direct wave coexist like in the Rician fading environment, and further accurate frequency control can be provided to a direct wave. By performing operation with only phases in the first phase difference estimating unit and the second phase difference estimating unit, removal processing of a frequency deviation can be realized by an apparatus with simple a configuration.

In the present invention, the first phase difference estimating unit located in the previous stage of the second phase difference estimating unit estimates a frequency deviation between adjacent known signals, and after the frequency deviation is removed according to a result of the estimation, further, the second phase difference estimating unit estimates a frequency deviation in N2, and the results of estimation of the frequency deviation in both the phase difference estimating units are synthesized. Therefore, a wide detection range for a frequency deviation in the first phase difference estimating unit and high precision in estimation of a frequency deviation in the second phase difference estimating unit can simultaneously be realized. In addition, with the present invention, a frequency deviation of a direct wave can be estimated with higher precision even in a situation where a multi-path wave and a direct wave coexist like in the Rician fading environment, therefore accurate frequency control can be provided to a direct wave.

In the present invention, the first phase difference estimating unit estimates a frequency deviation in N1 and the second phase difference estimating unit estimates a frequency deviation in N2 regardless of the order thereof, and a frequency deviation in one symbol is computed according to both of these frequency deviations. Therefore, for example, a wide detection range for a frequency deviation in the first phase difference estimating unit and high precision in estimation of a frequency deviation in the second phase difference estimating unit can simultaneously be realized.

In the present invention, the phase difference selecting unit selects the first phase difference estimated by the first phase difference estimating unit or the phase difference estimated by the second phase difference estimating unit. Therefore, for example, a wide detection range for a frequency deviation in the first phase difference estimating unit or high precision in estimation of a frequency deviation in the second phase difference estimating unit can be selected.

In the present invention, the first inter-symbol phase difference computing unit and the second inter-symbol phase difference computing unit are located behind the first phase difference estimating unit and second phase difference estimating unit respectively, each of them compute a phase difference in one symbol, and then the phase difference selecting unit selects either one of the outputs from the inter-symbol phase difference computing units. Therefore, for example, a wide detection range for a frequency deviation in the first phase difference estimating unit or high precision in estimation of a frequency deviation in the second phase difference estimating unit can be selected.

In the present invention, the first phase difference estimating unit estimates a frequency deviation between adjacent known signals and the second phase difference estimating unit estimates a frequency deviation in N1 regardless of the order thereof, and a frequency deviation in one symbol is computed according to both of the frequency deviations. Therefore, for example, a wide detection range for a frequency deviation in the first phase difference estimating unit and high precision in estimation of a frequency deviation in the second phase difference estimating unit can simultaneously be realized.

In the present invention, the phase difference selecting unit selects the first phase difference estimated by the first phase difference estimating unit or the phase difference estimated by the second phase difference estimating unit. Therefore, for example, a wide detection range for a frequency deviation in the first phase difference estimating unit or high precision in estimation of a frequency deviation in the second phase difference estimating unit can be selected.

In the present invention, the first inter-symbol phase difference computing unit and the second inter-symbol phase difference computing unit are located behind the first phase difference estimating unit and second phase difference estimating unit respectively, each of them compute a phase difference in one symbol, and then the phase difference selecting unit selects either one of the outputs from the inter-symbol phase difference computing units. Therefore, for example, a wide detection range for a frequency deviation in the first phase difference estimating unit or high precision in estimation of a frequency deviation in the second phase difference estimating unit can be selected.

In the present invention, average processing of phase differences in a burst is performed to a burst signal in TDMA, further average processing of phase differences over bursts is performed, and a value of a forgetting factor as a parameter in the weighted average is appropriately selected. Therefore, an estimation error for phase fluctuation due to fading as well as for a frequency deviation affected by noises or the like can be reduced.

In the present invention, a phase difference in one symbol is computed, and average processing is executed to phase differences over symbols. Therefore, an estimation error for phase fluctuation due to fading as well as for a frequency deviation affected by noises or the like can further be reduced.

In the present invention, as only the known signal is used for configuration thereof, a frequency deviation can be removed with simple processing, with which it is possible to realize improvement of receiver performance. In addition, with the present invention, as desired precision of estimation of a frequency can be obtained in a comparatively short period of time even in an environment with a low C/N, the tracking performance to time-dependent fluctuation in a frequency deviation caused by the Doppler effect or the like becomes excellent. With the present invention, a frequency deviation of a direct wave can be estimated with higher precision even in a situation where a multi-path wave and a direct wave coexist like in the Rician fading environment, therefore high-precision frequency control can be provided to a direct wave.

In the present invention, a phase deviation is removed before waveform shaping is executed to a digital baseband signal by means of filtering processing. Therefore, even when a frequency deviation is larger as compared to a cutoff frequency of a LPF, the frequency deviation can be removed without reduction of a portion of signal power.

In the present invention, the oscillator control unit controls a voltage controlled oscillator according to a frequency deviation detected by the frequency deviation estimating unit. Therefore, even when a frequency deviation is larger as compared to a cutoff frequency of a LPF, the frequency deviation can be removed without reduction of a portion of signal power.

In the present invention, the oscillator control unit or phase rotating unit is switched according to a frequency deviation detected by the frequency deviation estimating unit. Therefore, even when a frequency deviation is large at the time of capturing a signal in an initial stage, the frequency deviation can be removed without reduction of a portion of signal power by means of a cutoff frequency of a LPF. In addition, with the present invention, switching control of a frequency deviation is executed according to information for frequency deviation from the phase difference computing unit, therefore an optimal removal of frequency deviation according to the information for the frequency deviation can be made.

Other objects and features of this invention will become apparent from the following description with reference to the accompanying drawings.

DESCRIPTION OF THE PREFERRED EMBODIMENTS

Detailed description is made below for the present invention with reference to the attached drawings.

Figure 1:
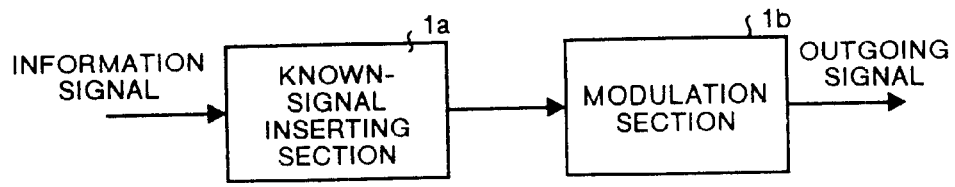
FIG. 1 is a block diagram showing a transmitter according to Embodiment 1 of the present invention which periodically inserts a known signal into an outgoing signal.

FIG. 1 is a block diagram showing configuration of a transmitter in an automatic frequency control apparatus, namely a transmitter which periodically inserts a known signal into an outgoing signal according to Embodiment 1 of the present invention. In FIG. 1, designated at the reference numeral 1a is a known-signal inserting section, and designated at 1b is a modulation section. This transmitter inserts, for instance, a pilot signal which is a known signal into an outgoing signal. It should be noted that, in the following description, a known signal is not always limited to a pilot signal, and that any type of signal may be used as long as the purpose can be achieved.

Operations of the transmitter shown in FIG. 1 are explained here. At first the known-signal inserting section 1a periodically inserts a known signal into information signal to be transmitted. More specifically, a signal outputted from this known-signal inserting section 1a has the configuration as shown, for instance, in FIG. 2 in which a known signal with $N_P$ symbols ($N_p \geq 1$) is periodically inserted into an information signal with ($N_F-N_p$) symbols. It is assumed herein that this known signal with $N_p$ symbols is inserted once for time $t=(kN_F+i)T_S$, $0 \leq i \leq N_p-1$ ($T_S$: symbol duration) and that a value of the known signal is, for instance, bp. The modulation section 1b modulates the signal outputted from the known-signal inserting section 1a, and outputs the modulated signal as an outgoing signal.

Assuming that this outgoing signal is, for instance, S(t), this outgoing signal S(t) can be expressed by the equation (5) below:

$$S(t) = A \sum_{n=-\infty}^{\infty} b(n)p(t - nT_S) \qquad (5)$$

Herein b(n) indicates a value of an n-th symbol having been subjected to BPSK, QPSK, or QAM modulation, and A indicates the amplitude of the outgoing signal, while p(t) indicates a normalized single pulse wave.

Figure 3:
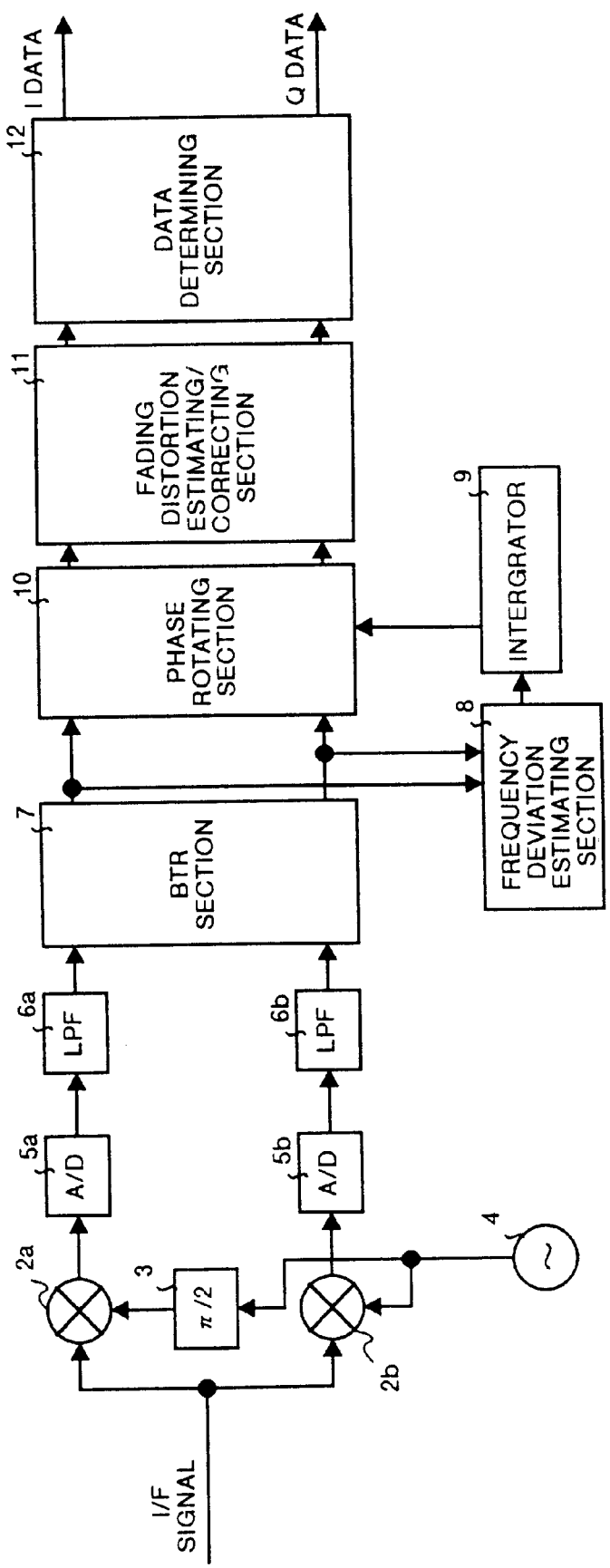
FIG. 3 is a block diagram showing a receiver according to Embodiment 1 of the present invention for removing a frequency deviation using the known signal periodically inserted into the outgoing signal.

FIG. 3 is a view showing configuration of a receiver of the automatic frequency control apparatus according to the present invention, namely a receiver which receives the outgoing signal from the above explained transmitter and removes a frequency deviation using the known signal periodically inserted into the incoming signal. In FIG. 3, designated at the reference numerals 2a, 2b are multipliers, designated at 3 is a π/2 phase shifter, designated at 4 is a oscillator, designated at 5a, 5b are analog/digital converters (described as an A/D converters), designated at 6a, 6b are low-pass filters (described as LPFs), designated at 7 is a Bit-timing recovery section (described as BTR) section, designated at 8 is a frequency deviation estimating section, designated at 9 is an integrator, designated at 10 is a phase rotating section, designated at 11 is a fading distortion estimating/compensating section, and designated at 12 a data determining section.

Operations of the receiver shown in FIG. 3 are explained here. At first, a sinusoidal wave signal having a frequency which is substantially equal to that of a carrier wave in the incoming I/F signal is generated by the oscillator 4. Then the π/2 phase shifter 3 shifts the phase of this sinusoidal wave signal outputted from the oscillator 4 by π/2 radian. The multiplier 2a multiplies the incoming I/F signal and the sinusoidal wave signal outputted from the π/2 phase shifter 3 and outputs a I-channel analog baseband signal. On the other hand, the other multiplier 2b multiplies the incoming I/F signal and the sinusoidal wave signal outputted from the oscillator 4, and outputs a Q-channel analog baseband signal. These analog baseband signals r(t) can be expressed by the following equation (6) using the outgoing signal S(t):

$$r(t) = r_I(t) + jr_Q(t) \qquad (6)$$
$$= c(t)S(t) + n(t)$$

Herein $r_I(t)$ indicates an I-channel baseband signal, while $r_Q(t)$ indicates a Q-channel analog baseband signal. n(t) indicates an additive white Gaussian noise, while c(t) indicates an amount of distortion due to fading, and all of these values are complex.

Each the having received the analog baseband signal samples the I-channel and Q-channel baseband signals at a specified interval. Further the A/D converters 5a, 5b convert the amplitude of the sampled signal to digital values, and output the converted signals as I-channel and Q-channel digital baseband signals respectively. Each of the LPFs 6a, 6b executes a filtering processing for shaping a waveform with a Nyquist filter or the like to the I-channel and Q-channel digital baseband signals outputted from the A/D converters 5a, 5b.

After the filtering processing, the BTR section 7 detects Nyquist points from the I-channel and Q-channel digital baseband signals outputted from the LPFs 6a, 6b, and outputs the I-channel and Q-channel digital baseband signal $r(kN_F+i)$ at the time $t=(kN_F+i)T_S$ corresponding to the Nyquist point. Namely the I-channel and Q-channel digital baseband signals $r(kN_F+i)$ can be expressed by the following equation (7):

$$r(kN_F + i) = Ac(kN_F + i)b(kN_F + i) + n(kN_F + i) \qquad (7)$$

$$= u(kN_F + i)b(kN_F + i) + n(kN_F + i)(u(kN_F + i) \equiv$$

$$Ac(kN_F + i))$$

It should be noted that, $T_S$ in each parentheses is omitted for simplifying the expression.

The frequency deviation estimating section 8 detects a frequency deviation as described above from the I-channel and Q-channel digital baseband signals corresponding to the Nyquist points outputted from the BTR section 7. Then the integrator 9 executes processing for integration by iterative addition with one symbol cycle using a phase difference $\theta_S(kN_F)$ in one symbol outputted from the frequency deviation estimating section 8. A result of processing for integration is expressed by the following equation (8):

$$\theta(kN_F+i)=\theta(kN_F+i-1)+\theta_S(kN_F),\ 0 \leq i \leq N_F-1 \qquad (8)$$

The phase rotating section 10 execute processing for rotating the phase for each symbol to the I-channel and Q-channel digital baseband signals $r(kN_F+i)$ using the integrated value of the a phase difference in one symbol obtained by the integrator 9, and removes a frequency deviation estimated by the frequency deviation estimating section 8. Namely, the processing as expressed by the following equation (9) is executed:

$$r_R(kN_F+i)=r(kN_F+i)\exp[-j\theta(kN_F+i)],\ 0 \leq i \leq N_F-1 \qquad (9)$$

Then the frequency deviation fading distortion estimating/compensating section 11 removes a distortion in the signal due to fading or the like from the I-channel and Q-channel digital baseband signals $r_R(kN_F+i)$ each with a frequency deviation having been removed therefrom outputted from the phase rotating section 10. Finally, the data determining section 12 determines the transmitted data b(n), namely a value of the n-th symbol according to the I-channel and Q-channel digital baseband signals each with distortion due to fading having been compensated outputted from the fading distortion estimating/compensating section 11.

Configuration and operations of the frequency deviation estimating section 8 which detects a frequency deviation included in the I-channel and Q-channel digital baseband signals by using a known signal inserted into an outgoing signal is explained below with reference to the related drawing.

Figure 4:
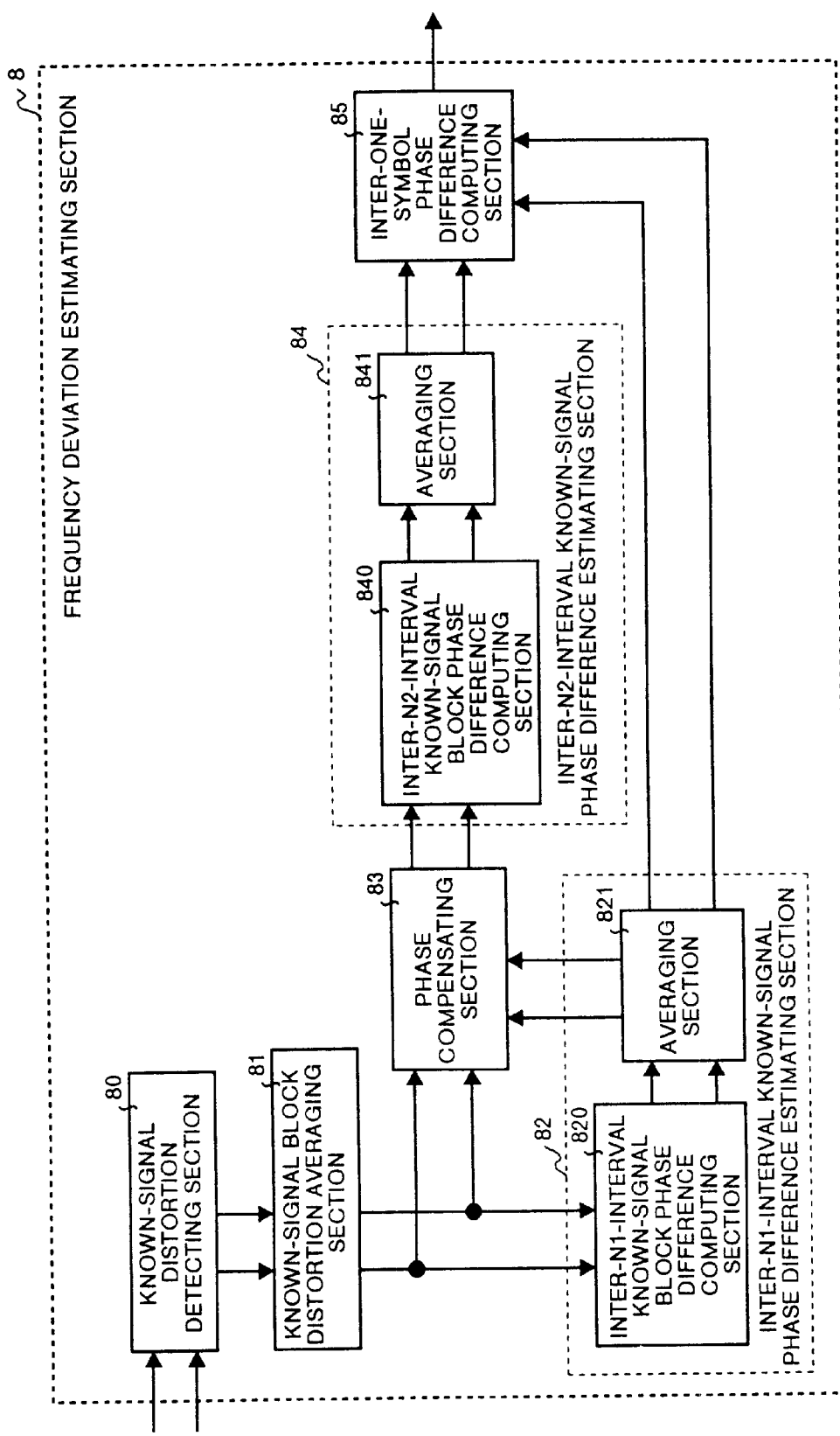
FIG. 4 is a view showing an example of configuration of a frequency deviation estimating section 8 according to Embodiment 1.

FIG. 4 is an example of configuration of the frequency deviation estimating section 8. In FIG. 4, designated at the reference numeral 80 is a known-signal distortion detecting section, designated at 81 is a known-signal block distortion averaging section, designated at 82 is a inter-N1-interval known-signal phase difference estimating section, designated at 820 is a inter-N1-interval known-signal block phase difference computing section, designated at 821 is an averaging section, designated at 83 is a phase compensating section, designated at 84 is an inter-N2-interval known-signal phase difference estimating section, designated at 840 is a inter-N2-interval known-signal block phase difference computing section, designated at 841 is an averaging section, and designated at 85 is an inter-one-symbol phase difference computing section.

Operations of the frequency deviation estimating section 8 are explained here. At first the known-signal distortion detecting section 80 detects a fading distortion $c_{EPi}(kN_F+i)$, as expressed, for instance, by the equation (10), from the $N_P$ symbol known signal periodically inserted at $N_F$ symbol interval into the I-channel and Q-channel digital baseband signals $r(kN_F+i)$:

$$c_{EPi}(kN_F + i) = \frac{r(kN_F + i)}{bp} \qquad (10)$$

$$= u(kN_F + i) + \frac{n(kN_F + i)}{bp},\ 0 \leq i \leq N_P - 1$$

It should be noted herein that the successive $N_P$ symbol known signals is described as a known signal block.

After the fading distortion is detected in the known-signal distortion detecting section 80, the known-signal block distortion averaging section 81 averages the distortion $c_{EPi}(kN_F+i)$, $0 \leq i \leq N_p-1$ in the channel for the known signal. For instance, assuming that the average of the distortion in the channel is $c_{EP}(kN_F)$, then $c_{EP}(kN_F)$ can be computed by the following equation (11):

$$c_{EP}(kN_F) = \frac{1}{N_P} \sum_{i=0}^{N_P-1} c_{EPi}(kN_F + i) \qquad (11)$$

After the average has been computed, the inter-N1-interval known-signal phase difference estimating section 82 estimates a phase difference vector in the known-signal from the average $c_{EP}(kN_F)$ of the distortion outputted from the known-signal block distortion averaging section 81. In the inter-N1-interval known-signal block phase difference computing section 820, a phase difference vector is computed from the average $c_{EP}(kN_F)$ of distortion in the channel in the known signal block outputted from the known-signal block distortion averaging section 81 as well as from the average $c_{EP}(kN_F)$ of distortion in the channel in the known signal block separated with N1 interval therefrom. It should be noted that a value of N1 is, for instance, equal to $N_F$, namely a number of symbols corresponding to an insertion interval into a known signal block. Accordingly, in this case, a phase difference vector $D_{EP1}(kN_F)$ can be computed as expressed by the equation (12):

$$D_{EP1}(kN_F)=c_{EP}((k+1)N_F)c_{EP}^*(kN_F) \qquad (12)$$

Herein * indicates a complex conjugate. It should be noted that, in this embodiment, assuming a modulating symbol rate as $R_S$ (symbol/s), a detection range of the frequency deviation $-f_{DET}[Hz]-f_{DET}[Hz]$ is expressed by the same equation as the equation (4) expressed above, and that it has the same feature as that in the conventional technology.

The averaging section 821 having received the phase difference $D_{EP1}(kN_F)$ outputted from the N1-interval known-signal block phase difference computing section 820 computes an average $<D_{EP1}(kN_F)>$ of the phase differences $D_{EP1}(kN_F)$ as expressed by the equation (13).

$$\langle D_{EPI}(kN_F) \rangle = \frac{1}{2M_1+1} \sum_{k=-M_1}^{M_1} D_{EPI}(kN_F) \qquad (13)$$

Herein $M_1$ indicates a parameter which decides a number of phase difference vectors used for averaging, and herein the number of phase difference vectors used for averaging is $2M_1+1$ in all.

After the average $\langle D_{EP1}(kN_F)\rangle$ is computed, the phase compensating section 83 executes phase compensation using this average $c_{EP}(kN_F)$ for a fading distortion in a known signal block outputted from the known-signal block distortion averaging section 81 as well as from the average $\langle D_{EP1}(kN_F)\rangle$ of phase difference vectors between known signal blocks separated from each other at an N1 interval outputted from the averaging section 821. Namely, the fading distortion $c_{EP1}(kN_F)$ can be computed as expressed by the equation (14):

$$c_{EP1}(kN_F) = c_{EP}(kN_F)\exp(-j\theta_1(kN_F)) \quad (14)$$

$$\theta_1(kN_F) = \theta_1((k-1)N_F) + \theta_{EP}(kN_F)$$

$$\theta_{EP}(kN_F) = \tan^{-1}\frac{Im[\langle D_{EP1}(kN_F)\rangle]}{Re[\langle D_{EP1}(kN_F)\rangle]}$$

After the phase compensation, the inter-N2-interval known-signal phase difference estimating section 84 estimates a phase difference vector $D_{EP2}(kN_F)$ between the remaining known signals further using the fading distortion $c_{EP1}(kN_F)$ in a known-signal block outputted from the phase compensating section 83. Namely, estimates a phase difference vector $D_{EP2}(kN_F)$ from a fading distortion $c_{EP1}(kN_F)$ in a known signal block as well as from a fading distortion $c_{EP1}(kN_F+N2)$ in the N2-interval known-signal block phase difference computing section. It should be noted that the value of N2 indicates, for instance, L×$N_F$, namely a symbol interval L times larger than an insertion interval in the known block (L≧2). Therefore, in this case, the phase difference vector $D_{EP2}(kN_F)$ can be computed as expressed by the equation (15):

$$D_{EP2}(kN_F) = c_{EP1}((k+L)N_F)c_{EP1}^*(kN_F) \quad (15)$$

In this case, assuming a modulating symbol rate as $R_S$ (symbol/s), a detection range of the frequency deviation $-f_{DET}[Hz]-f_{DET}[Hz]$—in the inter-N2-interval known-signal phase difference estimating section 84 is expressed by the equation (16):

$$f_{DET} = \frac{R_S}{2LN_F} \quad (16)$$

The averaging section 841 computes an average $\langle D_{EP2}(kN_F)\rangle$ of the phase differences from the phase difference vector $D_{EP2}(kN_F)$ between know signal blocks separated from each other by an interval of N2 outputted from the inter-N2-interval known-signal block phase difference computing section 840 as expressed by the equation (17):

$$\langle D_{EP2}(kN_F)\rangle = \frac{1}{2M_2+1}\sum_{k=-M_2}^{M_2} D_{EP2}(kN_F) \quad (17)$$

Herein $M_2$ indicates a parameter which decides a number of phase difference vectors used for averaging, and in this case a number of phase difference vectors used for averaging is 2 $M_2$+1 in all.

Finally the inter-one-symbol phase difference computing section 85 computes a phase difference $\theta_S(kN_F)$ from the average $\langle D_{EP1}(kN_F)\rangle$ outputted from the inter-N1-interval known-signal phase difference estimating section 82 as well as from the average $\langle D_{EP2}(kN_F)\rangle$ of phase difference vectors outputted from the inter-N2-interval known-signal phase difference estimating section 84 as expressed by the equation (18):

$$\theta_S(kN_F) = \frac{\theta_{EP1}(kN_F)}{N_F} + \frac{\theta_{EP2}(kN_F)}{LN_F} \quad (18)$$

$$\theta_{EP1}(kN_F) = \tan^{-1}\frac{Im[\langle D_{EP1}(kN_F)\rangle]}{Re[\langle D_{EP1}(kN_F)\rangle]}$$

$$\theta_{EP2}(kN_F) = \tan^{-1}\frac{Im[\langle D_{EP2}(kN_F)\rangle]}{Re[\langle D_{EP2}(kN_F)\rangle]}$$

As described above, the frequency deviation estimating section 8 in the receiver as described above has the inter-N1-interval known-signal phase difference estimating section 82 and inter-N2-interval known-signal phase difference estimating section 84, so that the frequency deviation estimating section 8 has the following characteristics. For instance, by setting N1 to $N_F$ and N2 to L $N_F$ (L≧2), a range of detection of a frequency deviation by the inter-N1-interval known-signal phase difference estimating section 82 becomes L times wider than that by the inter-N2-interval known-signal phase difference estimating section 84. In this case, a range of detection of a frequency deviation by the inter-N2-interval known-signal phase difference estimating section 84 is narrower by 1/L times than that by the inter-N1-interval known-signal phase difference estimating section 82, but as it can be regarded as equivalent to a case where, by regarding a function of the inter-N2-interval known-signal phase difference estimating section 84 as that of a filter, the frequency band is made narrower by 1/L times, so that effects due to noises or other factors can be reduced by 1/L. Namely, precision of estimation of the frequency deviation in the inter-N2-interval known-signal phase difference estimating section 84 can be improved as compared to that in the inter-N1-interval known-signal phase difference estimating section 82.

Further, in the receiver according to this embodiment, as averaging processing is executed by the averaging sections 821, 841, it is possible to estimate fluctuation in the frequency due to the Doppler effect or the like between transmitters with high precision while reducing an estimation error of a frequency deviation due to a phase fluctuation due to fading or due to effects by noises or other factors.

Figure 5:
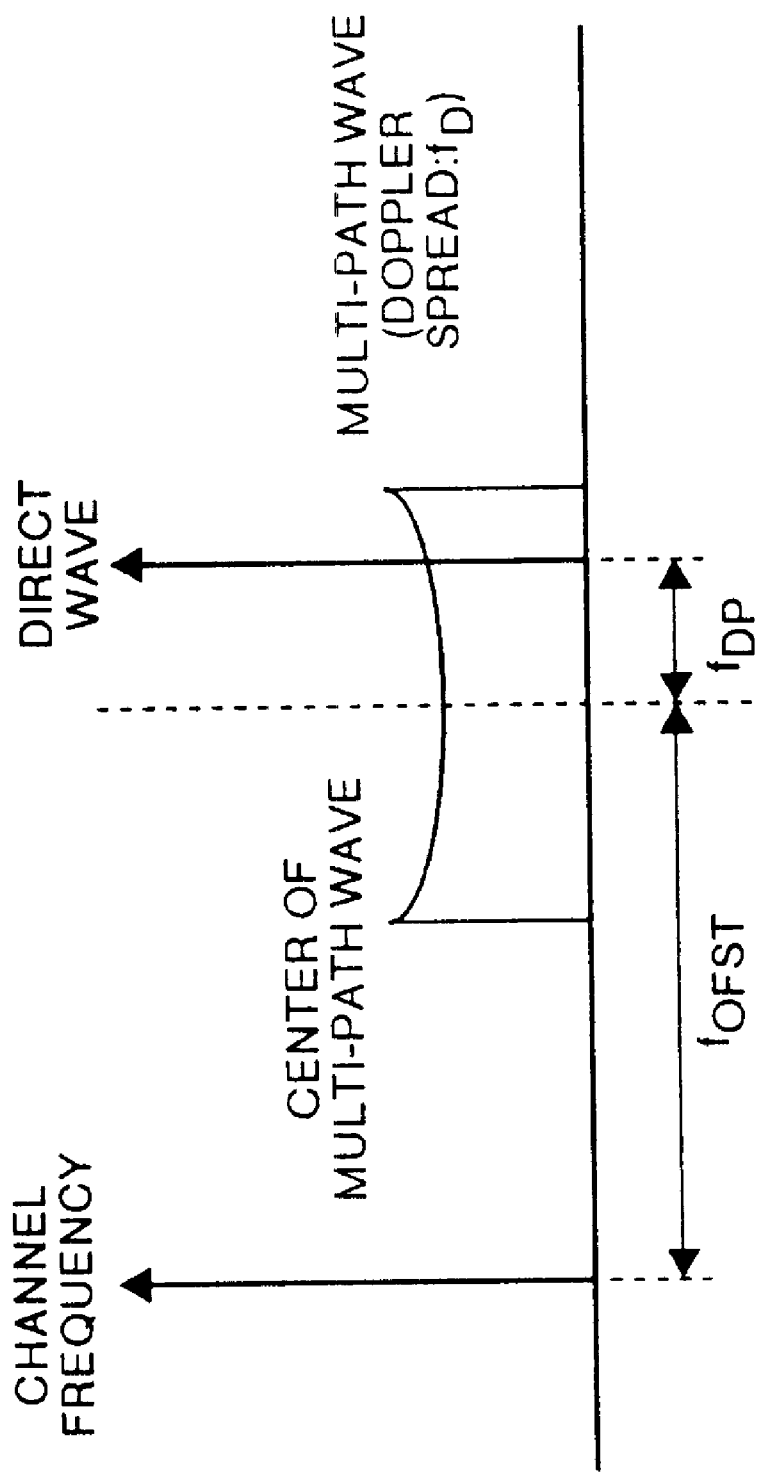
FIG. 5 is a view showing a direct wave under a fading environment.

Precision in estimating a frequency deviation with the receiver according to this embodiment of the present invention simulated with a computer by using a direct wave in the Rician fading environment as shown in FIG. 5 and that actually measured with the conventional type of receiver are shown in the table below. As understood from this table, precision in estimation of a frequency deviation in a direct wave in this embodiment is higher than that in the conventional technology. Namely, also in a situation where a multi-path wave and a direct wave coexist like in the Rician fading environment, the receive according to this embodiment can estimate a frequency deviation in a direct ware more precisely as compared to that based on the conventional technology, and further can provide more accurate controls over the direct wave.

Estimated value for a frequency deviation in a direct wave

| Frequency deviation in a direction wave (= $f_{PDP}+f_{OFST}$) | Value estimated with the proposed system (L = 3) | | Value estimated with the conventional technology | |
|---|---|---|---|---|
| | Average value [Hz] | Standard deviation [Hz] | Average value [Hz] | Standard deviation [Hz] |
| 140 Hz ($f_{DP}$ = 140 Hz, $f_{OFST}$ =0 Hz) | 141.4 | 12.6 | 77.3 | 64.3 |
| 240 Hz ($f_{DP}$ = 140 Hz, $f_{OFST}$ = 100 Hz) | 241.4 | 12.6 | 177.2 | 64.4 |

Conditions for the channel: Rician Fading (Power ratio between a direct wave and a multi-path wave=0 dB)

Doppler extension $f_D$=200 Hz $C/N_0$=44 dB

Frame format: $N_F$=12, $N_p$=2

As described above, in this embodiment, the inter-N1-interval known-signal phase difference estimating section 82 is located in an upstream side for estimation of a frequency deviation, and a frequency deviation is removed according to a result of estimation, and further a frequency deviation is estimated by the inter-N2-interval known-signal phase difference estimating section 84, and a result of estimation by the inter-N1-interval known-signal phase difference estimating section 82 and a result of estimation by the inter-N2-interval known-signal phase difference estimating section 82 are synthesized to each other. With this operation, both a wide range of frequency deviation detection by the inter-N1-interval known-signal estimating section 82 and high precision in estimation of a frequency deviation by the inter-N2-interval known-signal phase difference estimating section 84 can be realized at the same time.

In this embodiment, as only a known signal is used, the frequency deviation can be removed with simple configuration, so that receiver performance can be improved.

Further, as desired level of precision in estimation of a frequency deviation can be obtained by setting a value of $N_P$ to a value equal to or larger than 2, even in a low C/N environment within a relatively short period of time, so that the tracking performance to fluctuation of a frequency deviation due to the Doppler effect or for some other reasons as a function of passage of time is improved.

Further, like in the Rician fading environment, even if a multi-path wave and a direct wave coexist, a frequency deviation of the direct wave can be estimated with high precision, so that frequency control can be provided over the direct wave with high precision. It should be noted that, even when $N_p$ is equal to 1, the same effect can be achieved by saving the processing for averaging in the known-signal block distortion averaging section 81.

Figure 6:
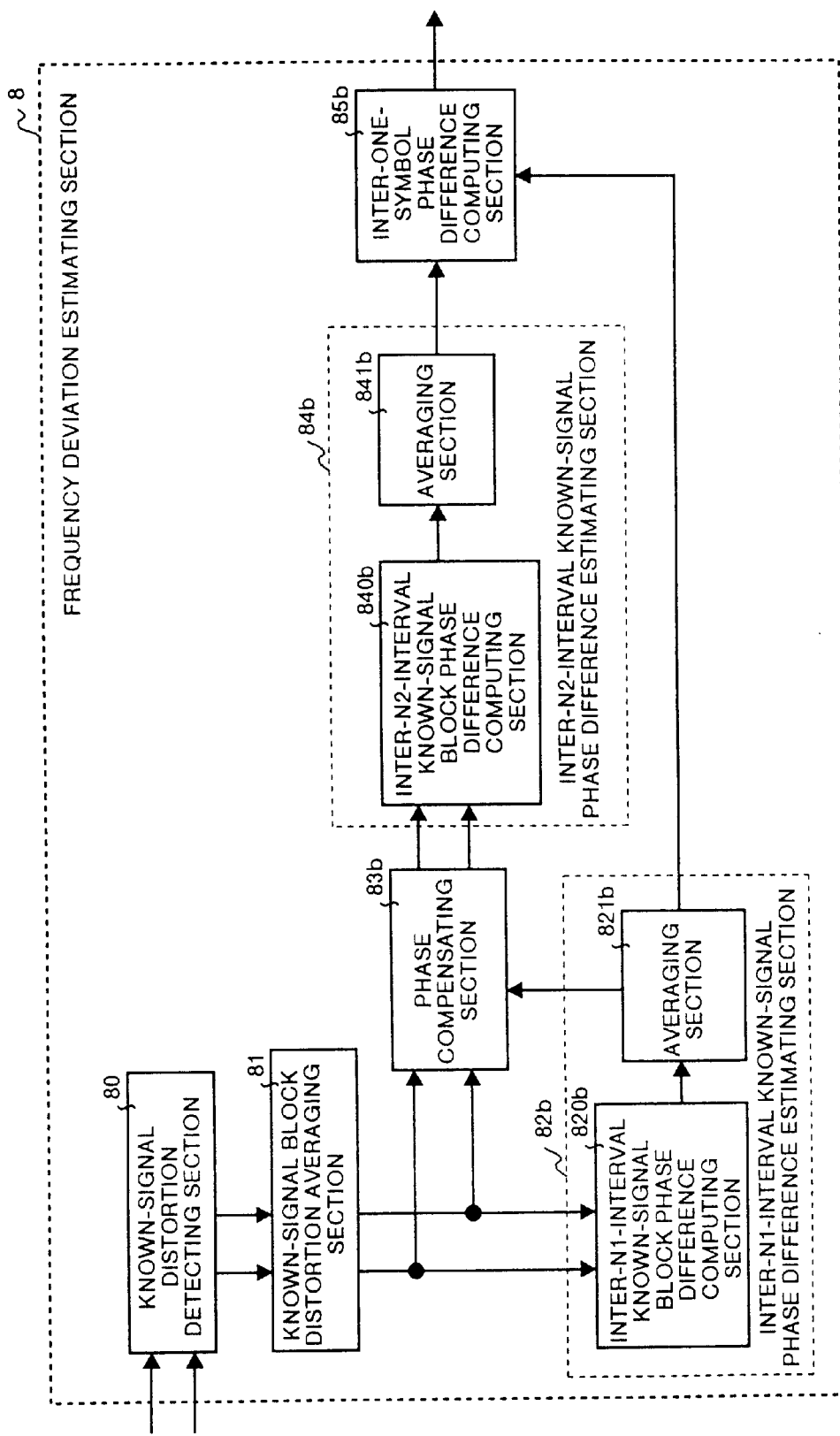
FIG. 6 is a view showing an example of configuration of the frequency deviation estimating section 8 according to Embodiment 2 of the present invention.

FIG. 6 is a view showing an example of configuration of the frequency deviation estimating section 8 according to Embodiment 2 of the present invention which has a different configuration as compared to the one in FIG. 4. In FIG. 6, designated at the reference numeral 80 is a known-signal distortion detecting section, designated at 81 is a known-signal block distortion averaging section, designated at 82b is an inter-N1-interval known signal phase difference estimating section, designated at 820b is a inter-N1-interval known-signal block phase difference computing section, designated at 821b is an averaging section, designated at 83b is a phase compensating section, designated at 84b is a inter-N2-interval known-signal phase difference estimating section, designated at 840b is a inter-N2-interval known-signal block phase difference computing section, designated at 841b is an averaging section, and designated at 85b is a inter-one-symbol phase difference computing section. It should be noted that, in the following description, for the same configuration as that in Embodiment 1 described above, namely for configuration of a portion of a transmitter as well as of a receiver, the same reference numerals are assigned to the same components and description thereof is omitted herein.

Operations of the frequency deviation estimating section 8 according to Embodiment 2 of the present invention are explained here. In the receiver according to this embodiment, configuration other than the frequency deviation estimating section 8 is the same as that of the receiver described in Embodiment 1, so that description of the same components is omitted herein, and description is made for processing for removing a frequency deviation with reference to the frequency deviation estimating section 8 shown in FIG. 6 in which different processing is executed therein.

At first, in the inter-N1-interval known-signal phase difference estimating section 82b, a phase difference between known signals is estimated from the average $c_{EP1}(kN_F)$ of fading distortions in a known signal block outputted from the known-signal block distortion averaging section 81. Namely, the inter-N1-interval known-signal block phase difference computing section 820b computes a phase difference from the average $c_{EP1}(kN_F)$ of the fading distortions in the known signal block as well as from the average $c_{EP1}(kN_F+N1)$ between known signal blocks separated from each other by the N1 interval. It should be noted that a value of N1 is, for instance, equal to $N_F$, namely a number of symbols corresponding to an insertion interval in a known signal block. Accordingly, the phase difference $\theta_{EP1}(kN_F)$ can be computed as expressed by the equation (19):

$$\theta_{EP1}(kN_F) = \theta_{EP}((k+1)N_F) - \theta_{EP}(kN_F) \quad (19)$$

$$\theta_{EP}(kN_F) = \tan^{-1}\frac{Im[c_{EP}(kN_F)]}{Re[c_{EP}(kN_F)]}$$

$$\theta_{EP}((k+1)N_F) = \tan^{-1}\frac{Im[c_{EP}((k+1)N_F)]}{Re[c_{EP}((k+1)N_F)]}$$

Also the averaging section 821b computes an average $<\theta_{EP1}(kN_F)>$ of the phase differences $\theta_{EP1}(kN_F)$ as expressed by the equation (20):

$$\langle\theta_{EPI}(kN_F)\rangle = \frac{1}{2M_1+1}\sum_{i=-M_1}^{M_1}\theta_{EPI}(iN_F) \quad (20)$$

Herein $M_1$ is a parameter which decides a number of phase differences used for averaging, and herein the number of phase differences used for averaging is $2M_1+1$ in all.

After the average $<\theta_{EP1}(kN_F)>$ of the phase differences $\theta_{EP1}(kN_F)$ is computed, the phase compensating section 83b executes phase compensation as described below using the average $c_{EP}(kN_F)$ of fading distortion outputted from the known-signal block distortion averaging section 81 and the average $<\theta_{EP1}(kN_F)>$ of phase differences between known signal blocks separated from each other at an N1 interval outputted from the averaging section 821b. Namely, the fading distortion $c_{EP1}(kN_F)$ after phase compensation can be computed as expressed by the equation (21):

$$c_{EP1}(kN_F)=c_{EP}(kN_F)\exp(-j\theta_1(kN_F))$$
$$\theta_1(kN_F)=\theta_1((k-1)N_F)+(\theta_{EP1}(kN_F)) \quad (21)$$

After phase compensation, the inter-N2-interval known-signal phase difference estimating section 84b estimates a phase difference $\theta_{EP2}(kN_F)$ between the remaining known signals using the fading distortion $c_{EP1}(kN_F)$ in a known signal block outputted from the phase compensating section 83b. Namely, the inter-N2-interval known-signal phase difference estimating section 840b computes the phase difference $\theta_{EP2}(kN_F)$ from the fading distortion $c_{EP1}(kN_F)$ outputted from the phase compensating section 83b and the average $c_{EP1}(kN_F+N2)$ of the fading distortion between known signal blocks separated from each other at an interval of N2. It should be noted that a value of N2 is, for instance, equal to L×$N_F$, namely a symbol interval L (L≧2) times larger than the insertion interval in a known signal block. Therefore, in this case, the phase difference $\theta_{EP2}(kN_F)$ can be computed as expressed by the equation (22):

$$\theta_{EP2}(kN_F) = \theta_{EP}((k+L)N_F) - \theta_{EP}(kN_F) \quad (22)$$
$$\theta_{EP}(kN_F) = \tan^{-1}\frac{Im[c_{EP}(kN_F)]}{Re[c_{EP}(kN_F)]}$$
$$\theta_{EP}((k+L)N_F) = \tan^{-1}\frac{Im[c_{EP}((k+L)N_F)]}{Re[c_{EP}((k+L)N_F)]}$$

The averaging section 841 computes the average $<\theta_{EP2}(kN_F)>$ of phase difference $\theta_{EP2}(kN_F)$ between known signal blocks separated from each other at an interval of N2 outputted from the inter-N2-interval known-signal block phase difference estimating section 840b as expressed by the equation (23):

$$\langle\theta_{EP2}(kN_F)\rangle = \frac{1}{2M_2+1}\sum_{i=-M_2}^{M_2}\theta_{EP2}(iN_F) \quad (23)$$

It should be noted herein that $M_2$ is a parameter which decides a number of phase differences used for averaging.

Finally, the inter-one-symbol phase difference computing section 85b computes a phase difference $\theta_S(kN_F)$ from the average $<\theta_{EP1}(kN_F)>$ outputted from the inter-N1-interval known-signal phase difference estimating section 82b as well as from the average $<\theta_{EP2}(kN_F)>$ outputted from the inter-N2-interval known-signal phase difference estimating section 84b as expressed by the equation (24):

$$\theta_S(kN_F) = \frac{\langle\theta_{EP1}(kN_F)\rangle}{N_F} + \frac{\langle\theta_{EP2}(kN_F)\rangle}{LN_F} \quad (24)$$

As described above, as the frequency deviation estimating section 8 in the automatic frequency control apparatus described above has the inter-N1-interval known-signal phase difference estimating section 82b and the inter-N2-interval known-signal phase difference estimating section 84b, so that the automatic frequency control apparatus can execute processing for removing a frequency deviation only according to a phase. Thus, a receiver having the same function as that according to Embodiment 1 of the present invention can be realized with simpler system configuration.

Figure 7:
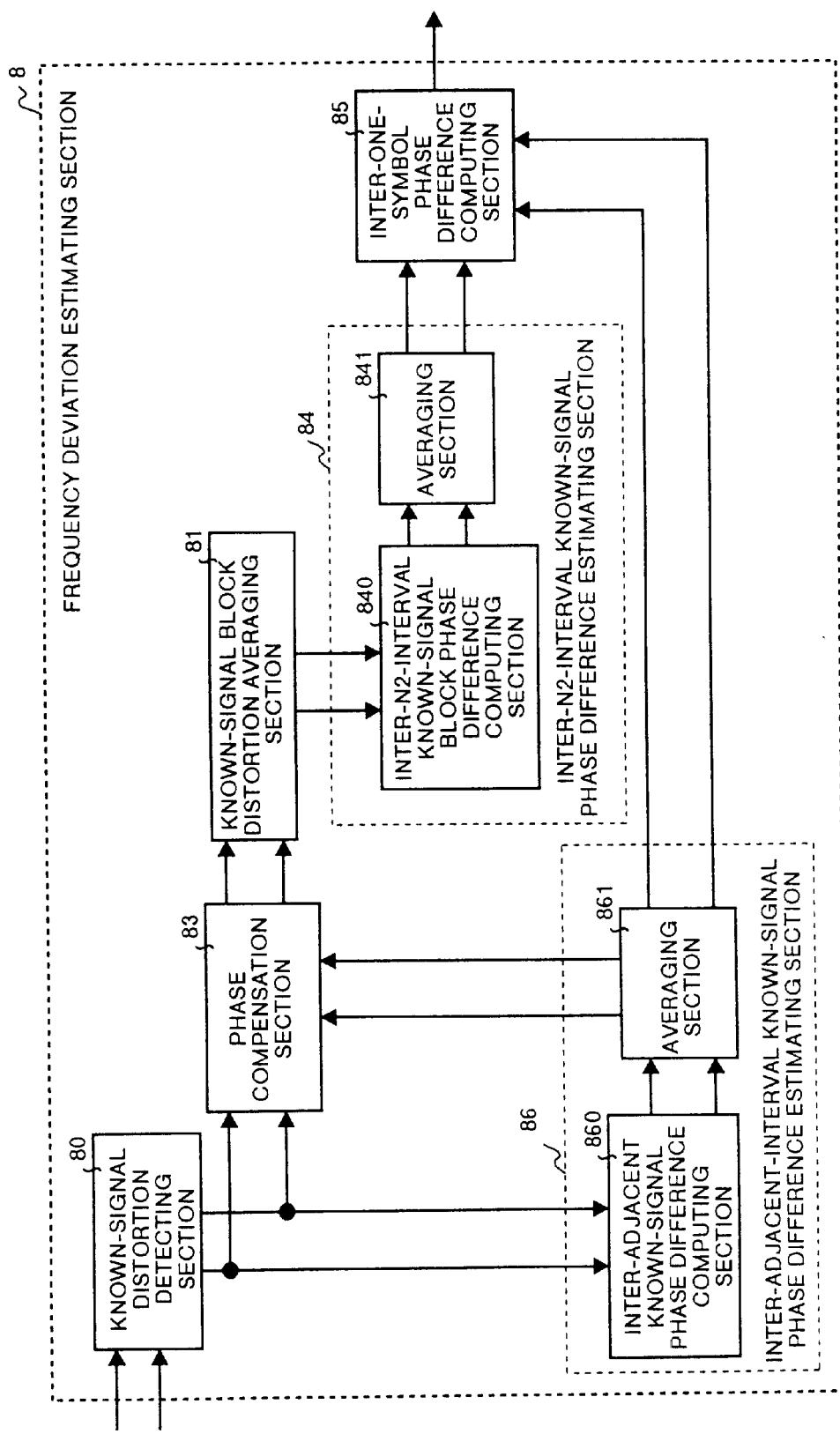
FIG. 7 is a view showing an example of configuration of the frequency deviation estimating section 8 according to Embodiment 3 of the present invention.

FIG. 7 is a view showing an example of configuration of the frequency deviation estimating section 8 according to Embodiment 3 of the present invention which has a different configuration as compared to the one shown in FIG. 6. In FIG. 7, designated at the reference numeral 80 is a known-signal distortion detecting section, designated at 86 is a inter-adjacent known-signal phase difference estimating section, designated at 860 is a inter-adjacent known-signal phase difference estimating section, designated at 861 is an averaging section, designated at 83 is a phase compensating section, designated at 81 is a known-signal block distortion averaging section, designated at 84 is a inter-N2-interval known-signal phase difference estimating section, designated at 840 is a inter-N2-interval known-signal block phase difference computing section, designated at 841 is an averaging section, and designated at 85 is a inter-one-symbol phase difference computing section. It should be noted that, in the following description, same reference numerals are assigned to the components corresponding to those in Embodiment 1 and Embodiment 2, namely those in a portion of the transmitter and receiver, and detailed description thereof is omitted herein.

Operations of the frequency deviation estimating section 8 according to Embodiment 3 of the present invention are explained here. In the receiver according to this embodiment, configuration other than the frequency deviation estimating section 8 is the same as that of the receiver described in Embodiment 1, so that description of the same portions of the configuration is omitted herein, and description is made for the processing for removing a frequency deviation with reference to the frequency deviation estimating section 8 shown in FIG. 7 in which different processing is executed. At first, the inter-adjacent known-signal phase difference estimating section 86 detects a phase difference vector between adjacent known signals from the fading distortion $c_{EPi}(kN_F+i)$, $0≦i≦N_F-1$, outputted from the known-signal distortion detecting section 80. Namely, the inter-adjacent known-signal phase difference estimating section 860 computes a vector of phase difference between adjacent signals according to the fading distortion $c_{EPI}(kN_F+i)$, $0≦i≦N_F-1$. The fading distortion $D_{EP1}(kN_F+i)$, $0≦i≦N_F-2$ can be computed as expressed by the equation (25):

$$D_{EP1}(kN_F+i)=c_{EP1}(kN_F+i+1)c_{EP1}*(kN_F+i), 0≦i≦N_F-2 \quad (25)$$

Herein * indicates a complex conjugate. Also in this case, assuming that modulating symbol rate is $R_S$ (symbol/s), a range of detection of a frequency deviation in the inter-adjacent-interval known-signal phase difference estimating section 86 $-f_{DET}$[Hz] to $f_{DET}$[Hz]—can be expressed by the equation (26):

$$f_{DET} = \frac{R_S}{2} \quad (26)$$

The averaging section 861 computes an average of phase differences $D_{FP1}(kN_F+i)$, $0≦i≦N_F-2$ between adjacent signals as expressed by the equation (27):

$$\langle D_{EPI}(kN_F)\rangle = \frac{1}{2M_1+1}\sum_{k=-M_1}^{M_1}\left(\frac{1}{N_P-1}\sum_{i=0}^{N_P-2}D_{EPI}(kN_F+i)\right) \quad (27)$$

It should be noted that $M_1$ is a parameter which decides a number of phase differences used for averaging.

After the average $<D_{EP1}(kN_F+i)>$ of the phase difference vectors $D_{EP1}(kN_F+i)$ is computed, the phase compensating section 83 executes phase compensation using the fading distortion $c_{EP1}(kN_F+i)$, $0 \leq i \leq N_F-1$, outputted from the known-signal distortion detecting section 80 and the average $\langle D_{EP1}(kN_F)\rangle$ of phase difference vectors between adjacent signals outputted from the inter-adjacent known-signal phase difference estimating section 86 as expressed by the equation (28):

$$c_{EPil}(kN_F + i) = c_{EPi}(kN_F + i)\exp-(-j\theta_1(kN_F + i)), 0 \leq i \leq N_P - 1 \quad (28)$$

$$\theta_1(kN_F + i) = \theta_1(kN_F + i - 1) + \theta_{EP}$$

$$\theta_{EP} = \tan^{-1}\frac{Im[\langle D_{EPI}(kN_F)\rangle]}{Re[\langle D_{EPI}(kN_F)\rangle]}$$

After phase compensation, the known-signal block distortion averaging section 81 executes processing for averaging the fading distortion $c_{EFPi1}(kN_F+i)$ in a known signal having been subjected to phase compensation and detected by the phase compensating section 83. Namely, the average $c_{EP1}(kN_F+i)$ of fading distortion $c_{EPi1}(kN_F+i)$ can be computed as expressed by the equation (29):

$$c_{EP1}(kN_F) = \frac{1}{N_P}\sum_{i=0}^{N_P-1} c_{EPil}(kN_F + i) \quad (29)$$

After the processing for averaging, the inter-N2-interval known-signal phase difference estimating section 84 further estimates a phase difference vector between remaining known signals using the average $c_{EP1}(kN_F)$ of fading distortion in a known signal block. Namely, the inter-N2-interval known-signal phase difference estimating section 840 computes a phase difference vector from the average $c_{EP1}(kN_F)$ of fading distortion in a known signal block outputted from the known-signal block averaging section 81 as well as from the average $c_{EP1}(kN_F+N2)$ of fading distortion between known signal blocks separated from each other at an interval of N2. It should be noted that a value of N2 is, for instance, equal to L×$N_F$, namely a symbol interval L (L≧1) times larger of an insertion interval in the known signal block. Accordingly, in this case, the phase difference vector $D_{EP1}(kN_F)$ can be computed, like in Embodiment 1, through the equation (15). It should be noted herein that, assuming a modulating symbol rate as $R_S$ (symbol/s), also a range −$f_{DET}$[Hz] to $f_{DET}$[Hz] of detection of a frequency deviation in the inter-N2-interval known-signal phase difference estimating section 84 can be realized as expressed by the equation (16) like in Embodiment 1.

The averaging section 841 computes an average $\langle D_{EP1}(kN_F)\rangle$ of phase difference vectors $D_{EP1}(kN_F)$ between known signal blocks separated from each other at an interval of N2 like in Embodiment 1 as expressed by the equation (17). It should be noted that $M_2$ is a parameter which decides a number of phase difference vectors used for averaging as described above.

Finally the inter-one-symbol phase difference computing section 85 computes a phase difference $\theta_S(kN_F)$ from the average $\langle D_{EP1}(kN_F)\rangle$ of phase difference vectors outputted from the inter-adjacent known-signal phase difference estimating section 86 as well as from the average $\langle D_{EP2}(kN_F)\rangle$ outputted from the inter-N2-interval known-signal phase difference estimating section 84 as expressed by the equation (30):

$$\theta_S(kN_F) = \theta_{EPI}(kN_F) + \frac{\theta_{EP2}(kN_F)}{LN_F} \quad (30)$$

$$\theta_{EPI}(kN_F) = \tan^{-1}\frac{Im[\langle D_{EPI}(kN_F)\rangle]}{Re[\langle D_{EPI}(kN_F)\rangle]}$$

$$\theta_{EP2}(kN_F) = \tan^{-1}\frac{Im[\langle D_{EP2}(kN_F)\rangle]}{Re[\langle D_{EP2}(kN_F)\rangle]}$$

As described above, the frequency deviation estimating section 8 has the inter-adjacent known-signal phase difference estimating section 86 and inter-N2-interval known-signal phase difference estimating section 84, so that the frequency deviation estimating section 8 has the following characteristics. For instance, a range of detection of the frequency deviation of the inter-adjacent known-signal phase difference estimating section 86 is (L*$N_F$) times wider than the range of detection of a frequency deviation of the inter-N2-interval known-signal phase difference estimating section 84. On the other hand, a range of detection of the frequency deviation of the inter-N2-interval phase difference estimating section 84 is 1/(L*$N_F$) times narrower than the range of the inter-adjacent known-signal phase difference estimating section 86. Thus, when the inter-N2-interval known-signal phase difference estimating section 84 is considered as a filter, it can be considered that the function is equivalent to that in a case when the frequency band is made narrower by 1/(L*$N_F$), so that effects due to noise or other factors can be reduced 1/(L*$N_F$) times. Namely, precision in detection of a frequency deviation by the inter-N2-interval known-signal phase difference estimating section 84 can be improved as compared to that by the inter-adjacent known-signal phase difference estimating section 86.

Further, in the frequency deviation estimating section 8 according to this embodiment, by selecting an appropriate number of samples for averaging in the averaging sections 861 and 841, an error in estimation of a frequency deviation due to phase fluctuation due to fading fluctuation or effects by noise or the like can be reduced.

As described above, in this embodiment, the inter-adjacent known-signal frequency deviation estimating section 86 is located in the upstream side for estimating a frequency deviation, and a frequency deviation is removed according to a result of estimation. Further, the frequency deviation is estimated by the inter-N2-interval known-signal frequency deviation estimating section 84, and finally a result of estimation of a frequency deviation by the inter-adjacent known-signal frequency deviation estimating section 86 and a result of estimation of a frequency deviation by the inter-N2-interval known-signal frequency deviation estimating section 84 are synthesized. Therefore, it is possible to realize detection of a frequency deviation by making use of both a wide range of detection of a frequency deviation by the inter-adjacent known-signal frequency deviation estimating section 86 and high precision in detection of a frequency deviation by the inter-N2-interval known-signal frequency deviation estimating section 84.

Further, the frequency deviation can be eliminated by using a known signal, which enables realization of improvement in receiver performance.

Further, even under the Rician fading environment in which a multi-path wave and a direct wave coexist, the frequency deviation of the direct wave can be estimated with high precision, so that high precision frequency control can be provided over the direct wave.

Further, by setting a value of $N_P$ to 2 or more, even in a low C/N environment, desired precision in estimation of a frequency deviation can be obtained within a relatively short period of time, so that the tracking performance to fluctuation of a frequency deviation in association with passage of time due to fluctuation of the Doppler effect is improved.

Figure 8:
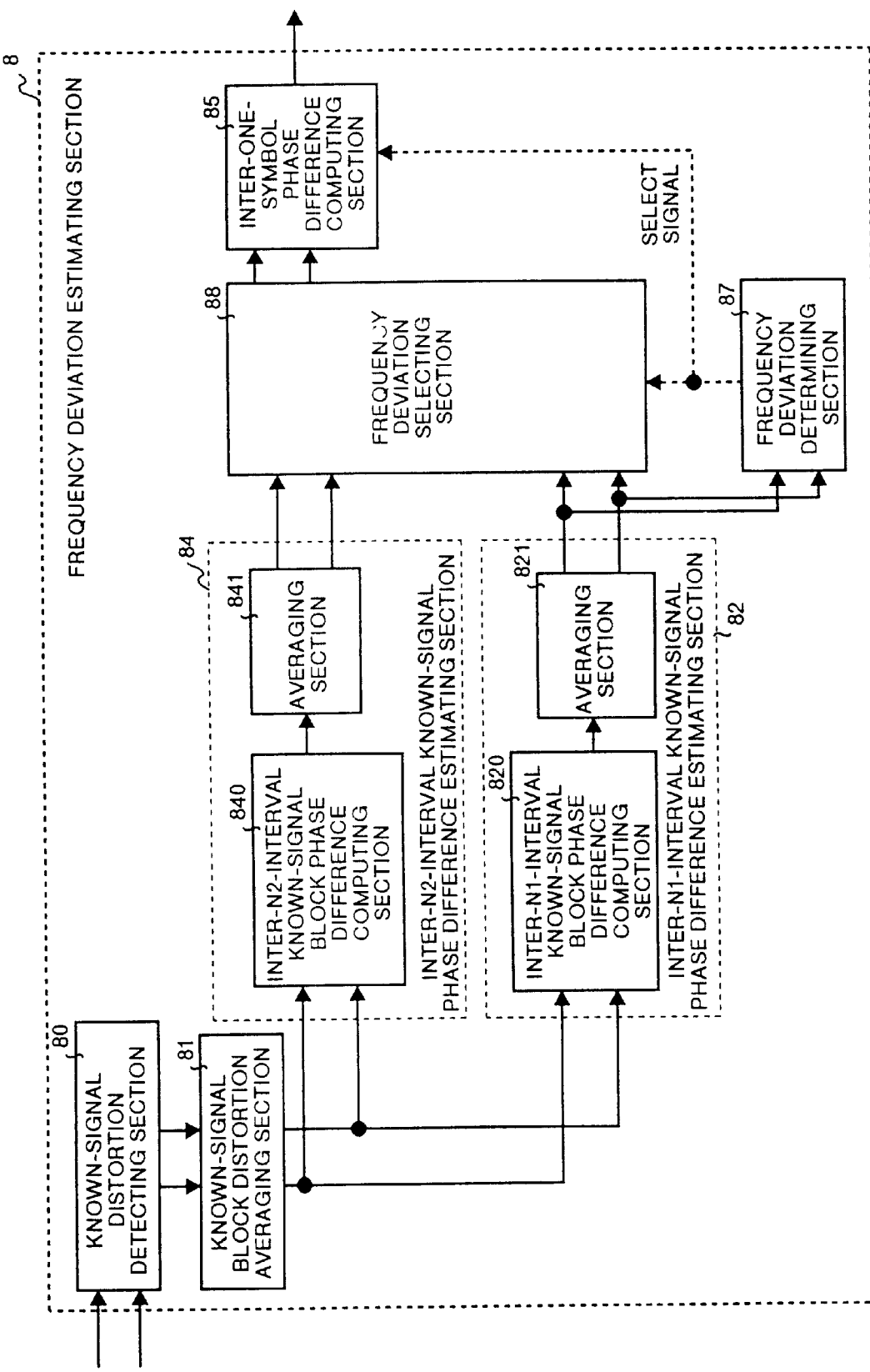
FIG. 8 is a view showing an example of configuration of the frequency deviation estimating section 8 according to Embodiment 4 of the present invention.

FIG. 8 is a view showing an example of configuration of the frequency deviation estimating section 8 according to Embodiment 4 of the present invention, and has a configuration which is different from the one shown in the FIG. 4, FIG. 6 and FIG. 7. In FIG. 8, designated at the reference numeral 80 is a known-signal distortion detecting section, designated at 81 is a known-signal block distortion averaging section, designated at 82 is a inter-N2-interval known-signal frequency difference estimating section, designated at 820 is a inter-N1-interval known-signal frequency difference estimating section, designated at 821 is an averaging section, designated at 84 is a inter-N2-interval known-signal frequency difference estimating section, designated at 840 is a inter-N2-interval known-signal block phase difference computing section, designated at 841 is an averaging section, designated at 87 is a frequency deviation determining section 87, designated at 88 is a frequency deviation selecting section, and designated at 85 is a inter-one-symbol phase difference computing section. It should be noted that, in the following description, the same reference numerals are assigned to the same components in Embodiments 1, 2, and 3, namely to components in the transmitter and receiver and description thereof is omitted herein.

Operations of the frequency deviation estimating section 8 according to Embodiment 4 of the present invention are explained here. In the receiver according to the present Embodiment, portions of the configuration other than the frequency deviation estimating section 8 are the same as that of the receiver described in Embodiment 1, so that description of the same configuration is omitted herein, and description is made for removal of a frequency deviation with reference to the frequency deviation estimating section 8 shown in FIG. 8.

At first, the inter-N1-interval known-signal phase difference estimating section 82 estimates a phase difference vector in a known signal from the average $c_{EP}(kN_F)$ of fading distortion in a known signal block outputted from the known-signal block distortion averaging section 81. Namely, the inter-N1-interval known-signal block phase difference estimating section 820 computes a phase difference from the average $c_{EP}(kN_F)$ of fading distortion in a known signal block as well as from the average $c_{EP}(kN_F+N1)$ of fading distortion between known signal blocks separated from each other at an interval of N1. It should be noted that a value of N1 is, for instance, equal to $N_F$, namely a number of symbols corresponding to an insertion interval in a known signal block. Therefore, in this case, the phase difference vector $D_{EP}(kN_F)$ can be computed, like in Embodiment 1, as expressed by the equation (12). In this embodiment, assuming that a modulating symbol rate is $R_S$ (symbol/s), a range $-f_{DET}[Hz]$ to $f_{DET}[Hz]$ of detection of a frequency deviation in the inter-N1-interval known-signal phase difference estimating section 82 can be computed, like in the conventional technology, as expressed by the equation (4).

Then the averaging section 821 computes the average $<D_{EP1}(kN_F)>$ of the phase difference vectors $D_{EP1}(kN_F)$ between known signal blocks separated from each other at an interval of N1, like in Embodiment 1, as expressed by the equation (13). It should be noted that $M_1$ is a parameter which decides a number of phase difference vectors used for averaging, and in this case, a number of phase difference vectors for averaging is $2*M_1+1$.

The inter-N2-interval known-signal phase difference estimating section 84 also estimates a phase difference vector between known signals from the average $c_{EP}(kN_F)$ of fading distortion in a known signal block outputted from the known-signal block distortion averaging section 81 described above. Namely, the inter-N2-interval known-signal block phase difference estimating section 840 computes a phase difference vector from the fading distortion $c_{EP1}(kN_F)$ in a known signal block as well as from the average $c_{EP1}(kN_F+N2)$ between known signal blocks separated from each other at an interval of N2. It should be noted that a value of N2 is, for instance, equal to $L*N_F$, namely a symbol interval L ($L \geq 2$) timers larger than the insertion interval in a known signal block. Accordingly, in this case, the phase difference $D_{EP2}(kN_F)$ can be computed as expressed by the equation (31):

$$D_{EP2}(kN_F)=c_{EP}((k+L)N_F)c_{EP}^*(kN_F) \qquad (31)$$

Then the averaging section 841 computes the average $<D_{EP2}(kN_F)>$ of phase difference vectors $D_{EP2}(kN_F)$ between known signal blocks separated from each other at an interval of N2, like in Embodiment 1, as expressed by the equation (17). It should be noted that $M_2$ is a parameter which decides a number of phase difference vectors used for averaging.

Then the frequency deviation determining section 87 detects a frequency deviation $\Delta f$ (select signal) using the average $<D_{EP2}(kN_F)>$ between known signal blocks separated from each other at an interval of N1 outputted from the inter-N1-interval known-signal phase difference estimating section 82, as expressed by the equation (32):

$$\Delta f = \frac{R_S}{2\pi N_F}\tan^{-1}\frac{Im[\langle D_{EP1}(kN_F)\rangle]}{Re[\langle D_{EP1}(kN_F)\rangle]} \qquad (32)$$

The frequency deviation selecting section 88 selects, for instance, when $|\Delta f| \geq R_S/(2LN_F)$, a signal from the inter-N1-interval known-signal phase difference estimating section 82, namely estimates a frequency deviation using a wider range of detection of a frequency deviation. On the other hand, if $|\Delta f|<R_S/(2LN_F)$, the frequency deviation selecting section 88 selects a signal from the inter-N2-interval phase difference estimating section 84, namely a frequency deviation with higher precision in estimation of a frequency deviation.

Finally the inter-one-symbol phase difference estimating section 85 computes the phase difference $\theta_S(kN_F)$ in one symbol using either the average $<D_{EP1}(kN_F)>$ of phase difference vectors selected by the frequency deviation selecting section 88 or the average $<D_{EP2}(kN_F)>$ of phase difference vectors, as expressed by the equation (33):

$$\theta_S(kN_F) = \qquad (33)$$

$$\begin{cases} \frac{\theta_{EP1}(kN_F)}{N_F}, \theta_{EP1}(kN_F) = \tan^{-1}\frac{Im[\langle D_{EP1}(kN_F)\rangle]}{Re[\langle D_{EP1}(kN_F)\rangle]}; |\Delta f| \geq \frac{R_S}{2LN_F} \\ \frac{\theta_{EP2}(kN_F)}{LN_F}, \theta_{EP2}(kN_F) = \tan^{-1}\frac{Im[\langle D_{EP2}(kN_F)\rangle]}{Re[\langle D_{EP2}(kN_F)\rangle]}; |\Delta f| \geq \frac{R_S}{2LN_F} \end{cases}$$

As described above, in the frequency deviation estimating section 8, the inter-N1-interval known-signal phase difference estimating section 82 or inter-N2-interval known-signal phase difference estimating section 84 is selected according to frequency deviation detection information from the frequency deviation determining section 87. With this feature, for instance, a wide range of detection of a frequency deviation by the inter-N1-interval known-signal phase difference estimating section 82 and high prevision in estimation of a frequency deviation by the inter-N2-interval known-signal phase difference estimating section 84 can be realized in the same device.

Figure 9:
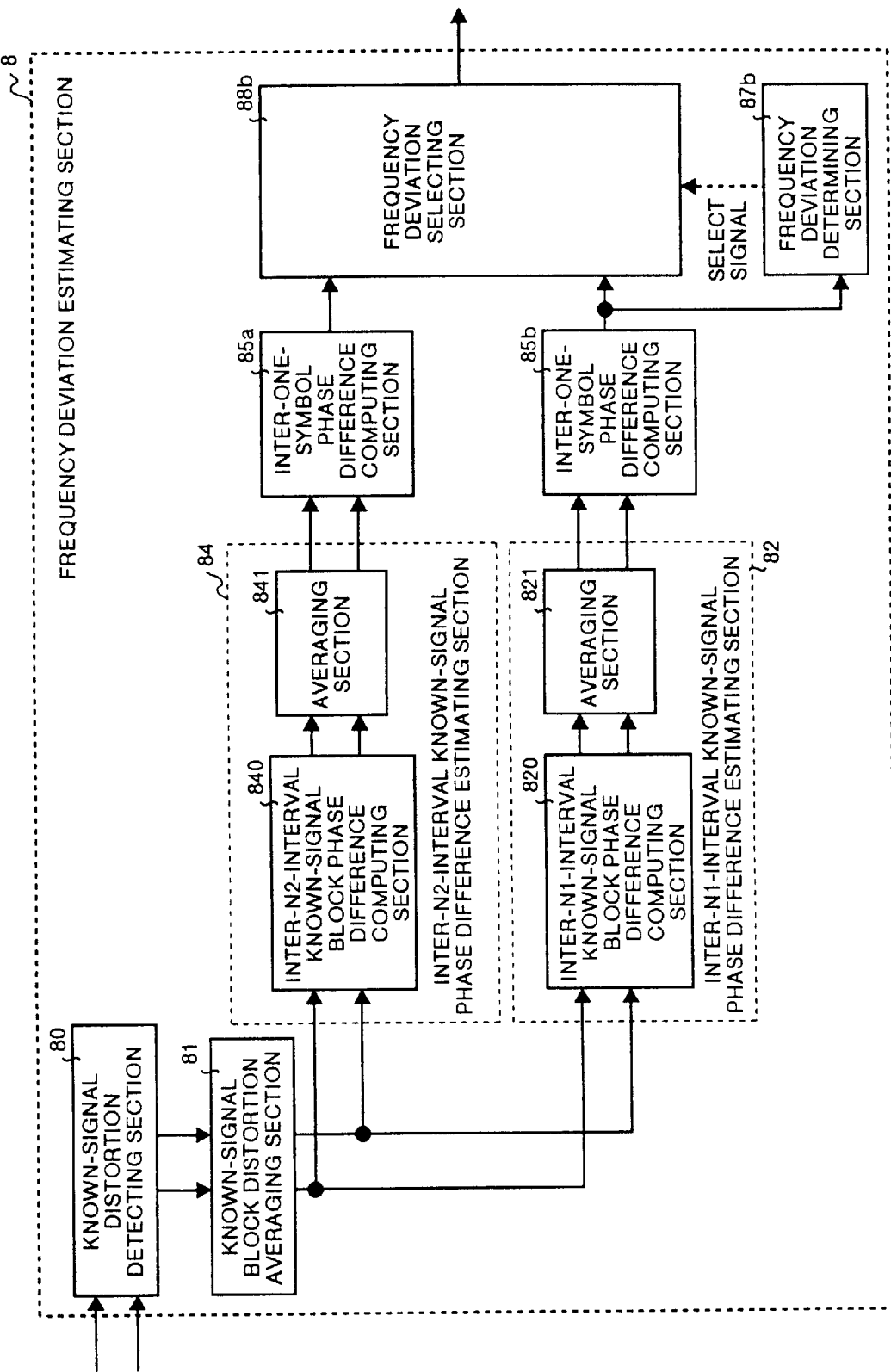
FIG. 9 is a view showing an application of the frequency deviation estimating section 8 shown in FIG. 8.

In the present Embodiment, the inter-one-symbol phase difference computing section 85 is located in the downstream from the frequency deviation selecting section 88. However, the configuration is not limited to this one, and a configuration as shown in FIG. 9 in which, for instance, inter-one-symbol phase difference estimating sections 85a, 85b are provided in the upstream from the inter-N1-intreval known-signal phase difference estimating section 82 and the inter-N2-interval phase difference estimating section 84 respectively so that a phase difference in one symbol is computed and then the output is switched under control by the frequency deviation determining section 87b and frequency deviation selecting section 88b is allowable. The same effects as described above can be achieved with this configuration.

Figure 10:
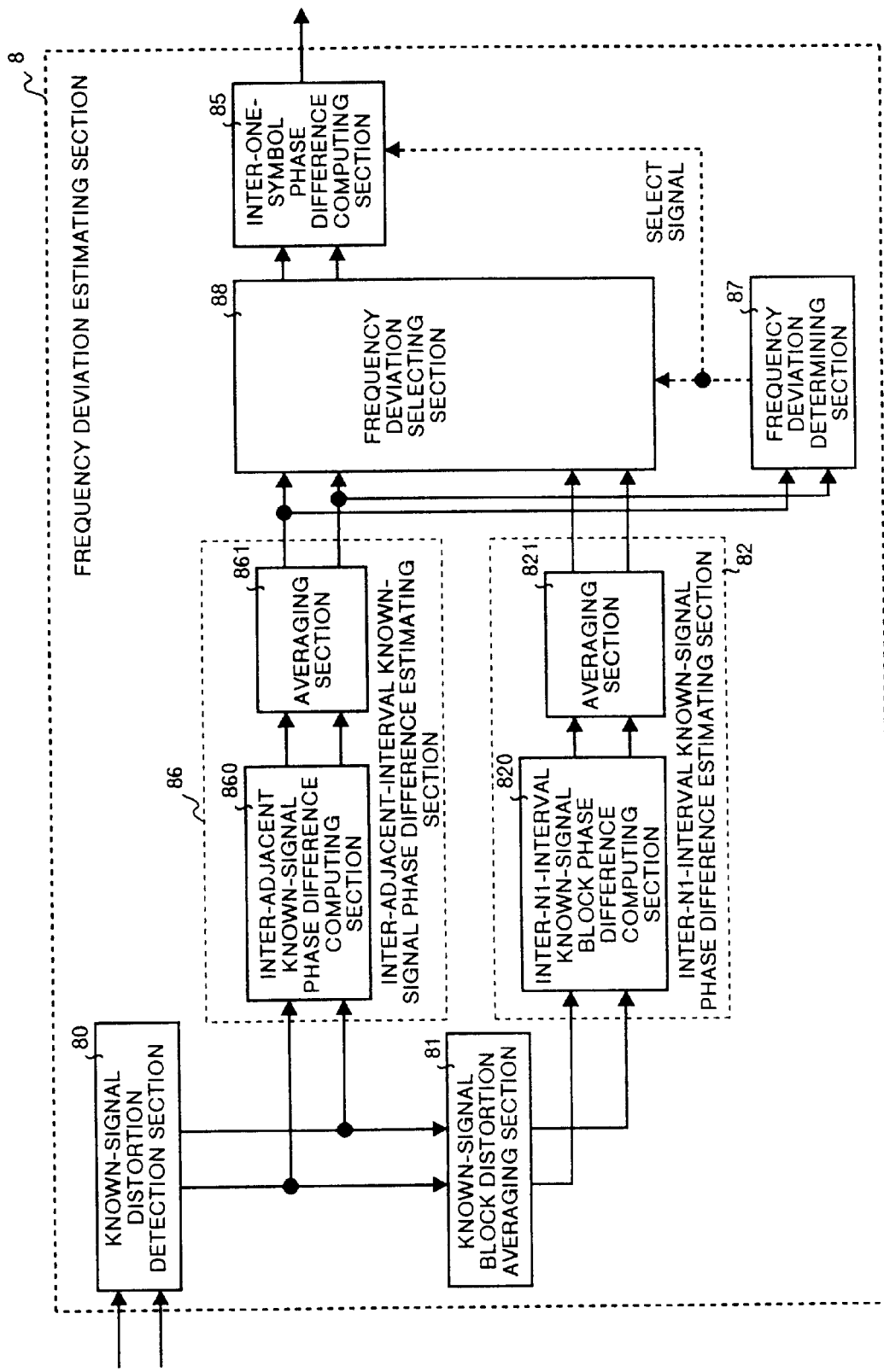
FIG. 10 is a view showing an example of the frequency deviation estimating section 8 according to Embodiment 5 of the present invention.

FIG. 10 is a view showing an example of configuration of the frequency deviation estimating section 8 according to Embodiment 5 of the present invention, and has a configuration which is different from the one explained in Embodiments 1 to 4. In FIG. 10, designated at the reference numeral 80 is a known-signal distortion detecting section, designated at 81 is a known-signal block distortion averaging section, designated at 82 is a inter-N1-interval known-signal phase difference estimating section, designated at 820 is a inter-N1-interval known-signal phase difference computing section, designated at 821 is an averaging section, designated at 86 is a inter-adjacent known-signal phase difference estimating section, designated at 860 is a inter-adjacent known-signal block phase difference computing section, designated at 861 is an averaging section, designated at 87 is a frequency deviation determining section, designated at 88 is a frequency deviation selecting section, and designated at 85 is a inter-one-symbol phase difference computing section. In the description hereinafter, the same reference numerals are assigned to components corresponding to those in Embodiment 2, 3 or 4, namely the transmitter and a portion of the receiver therein, and description thereof is omitted herein.

Operations of the frequency deviation estimating section 8 according to Embodiment 5 are explained here. The components other than the frequency deviation estimating section 8 of the receiver according to Embodiment 5 are the same as those in the receiver having been described in Embodiment 1, so that description of the same components is omitted herein, and the processing of removing a frequency deviation will be described by using the frequency deviation estimating section 8 in FIG. 10 in which the processing is different therefrom.

At first, the inter-adjacent known-signal phase difference estimating section 86 detects a phase difference vector between adjacent known signals from fading distortion $c_{EPi}(kN_F+i)$, $0 \leq i \leq N_F-1$ in a known signal outputted from the known-signal distortion detecting section 80. Namely, the inter-adjacent known-signal phase difference computing section 860 computes a phase difference vector between adjacent signals in the fading distortion $c_{EPi}(kN_F+i)$, $0 \leq i \leq N_F-1$ in a known signal. Accordingly, a phase difference vector $D_{EP1}(kN_F+i)$, $0 \leq i \leq N_F-2$ in a known signal can be computed as expressed by the equation (25) similarly to Embodiment 3.

An averaging section 861 computes the average $<D_{EP1}(kN_F+i)>$ as expressed by the equation (27), similarly to Embodiment 3, from the phase difference vector $D_{EP1}(kN_F+i)$, $0 \leq i \leq N_F-2$ between adjacent signals outputted from an inter-adjacent known-signal phase difference computing section 860. As explained above, $M_1$ is a parameter which decided a number of phase difference vectors used for averaging, and in this case, the number of phase difference vectors used for averaging is $(2*M_1+1)$ in total.

On the other hand, the inter-N1-interval known-signal phase difference estimating section 82 estimates a phase difference vector between known signals from the average $c_{EP}(kN_F)$ of fading distortions in a known signal block outputted from a known-signal block distortion averaging section 81. Namely, the inter-N1-interval known-signal block phase difference computing section 820 computes a phase difference vector from the average $c_{EP}(kN_F)$ of fading distortions in a known signal block as well as from an average $c_{EP}(kN_F+N1)$ of fading distortions between known signal blocks with an interval of N1 therebetween. The value of N1 is, for instance, $N1=L*N_F$ ($L \geq 1$), namely a number of symbols correlated to an insertion interval of a known signal block. Therefore in this case, a phase difference vector $D_{EP2}(kN_F)$ can be computed as expressed by the Equation (34).

$$D_{EP2}(kN_F)=c_{EP}((k+L)N_F)c_{EP}^*(kN_F) \quad (34)$$

The averaging section 821 computes, as expressed by the Equation (35), the average $<D_{EP2}(kN_F)>$ of phase difference vectors $D_{EP2}(kN_F)$ between known signals with an interval of N1 outputted from the inter-N1-interval known-signal block phase difference computing section 820.

$$\langle D_{EP2}(kN_F) \rangle = \frac{1}{2M_2+1} \sum_{k=-M_2}^{M_2} D_{EP2}(kN_F) \quad (35)$$

Where $M_1$ is a parameter which decides a number of phase difference vectors used for averaging.

Then, the frequency deviation determining section 87 detects a frequency deviation $\Delta f$ (select signal), as expressed by the equation (36), by using the average $<D_{EP1}(kN_F)>$ of phase difference vectors between adjacent known signals outputted from the inter-adjacent known-signal phase difference estimating section 86.

$$\Delta f = \frac{R_S}{2\pi} \tan^{-1} \frac{Im[\langle D_{EPj}(kN_F) \rangle]}{Re[\langle D_{EPj}(kN_F) \rangle]} \quad (36)$$

A frequency deviation selecting section 88 selects, similarly to Embodiment 4, a signal from the inter-adjacent known-signal phase difference estimating section 86, for instance, if a frequency deviation $|\Delta f| \geq R_S/(2*L*N_F)$ according to the frequency deviation $\Delta f$ obtained by the frequency deviation determining section 87, and selects a signal from the inter-N1-interval known-signal phase difference estimating section 82 if the frequency deviation $|\Delta f|<R_S/(2*L*N_F)$ Finally, the inter-one-symbol phase difference computing section 85 computes a phase difference $\theta_S(kN_F)$ in one symbol, as expressed by the equation (37), by using either the average $<D_{EP1}(kN_F)>$ of phase difference vectors outputted from the inter-adjacent known-signal phase difference estimating section 86 or the average $<D_{EP2}(kN_F)>$ of phase difference vectors outputted from the inter-N1- interval known-signal phase difference estimating section 82.

$$\theta_S(kN_F) = \tag{37}$$
$$\begin{cases} \theta_{EP1}(kN_F), \theta_{EP1}(kN_F) = \tan^{-1}\frac{Im[\langle D_{EP1}(kN_F)\rangle]}{Re[\langle D_{EP1}(kN_F)\rangle]}; |\Delta f| \geq \frac{R_S}{2LN_F} \\ \frac{\theta_{EP2}(kN_F)}{LN_F}, \theta_{EP2}(kN_F) = \tan^{-1}\frac{Im[\langle D_{EP2}(kN_F)\rangle]}{Re[\langle D_{EP2}(kN_F)\rangle]}; |\Delta f| \geq \frac{R_S}{2LN_F} \end{cases}$$

As described above, the frequency deviation estimating section 8 selects the inter-N1-interval known-signal phase difference estimating section 82 or the inter-adjacent known-signal phase difference estimating section 86 according to the value of the frequency deviation obtained in the frequency deviation determining section 87. With this feature, for instance, a wide detection range for a frequency deviation in the inter-adjacent known-signal phase difference estimating section 86 and high precision in estimation of a frequency deviation in the inter-N1-interval known-signal phase difference estimating section 82 can be realized in the same device.

Figure 11:
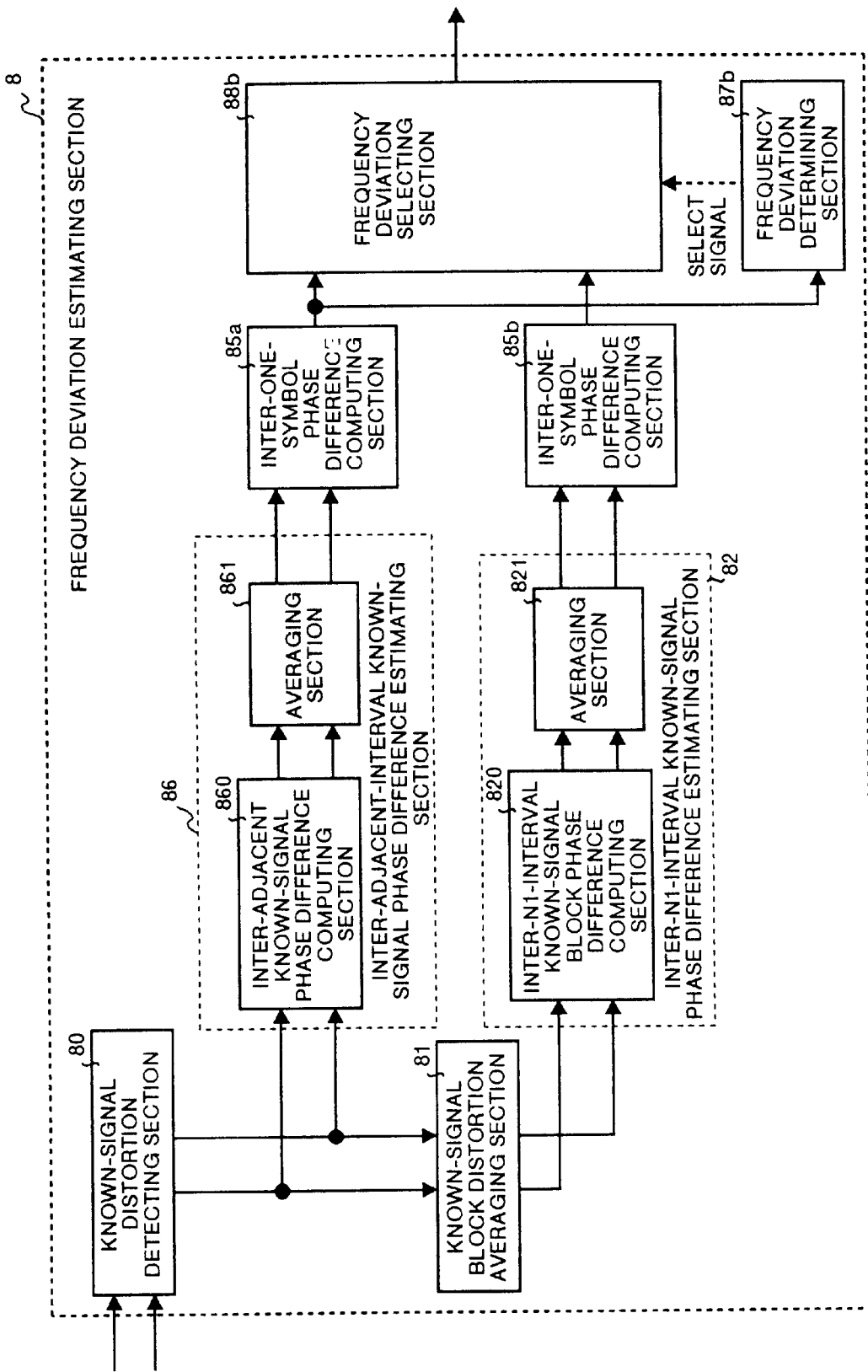
FIG. 11 is a view showing an application of the frequency deviation estimating section 8 shown in FIG. 10.

In the present Embodiment, the inter-one-symbol phase difference computing section 85 is located in the downstream from the frequency deviation selecting section 88. However, the configuration is not limited to this one, and a configuration as shown in FIG. 11 in which, for instance, inter-one-symbol phase difference computing sections 85a and 85b are provided in the upstream from the inter-N1-interval known-signal phase difference estimating section 82 and the inter-adjacent known-signal phase difference estimating section 86 respectively, phase difference in one symbol is computed in each of the inter-one-symbol phase difference computing sections 85a and 85b and output therefrom is switched by the frequency deviation selecting section 88b. The same effects as described above can be achieved with this configuration.

Figure 12:
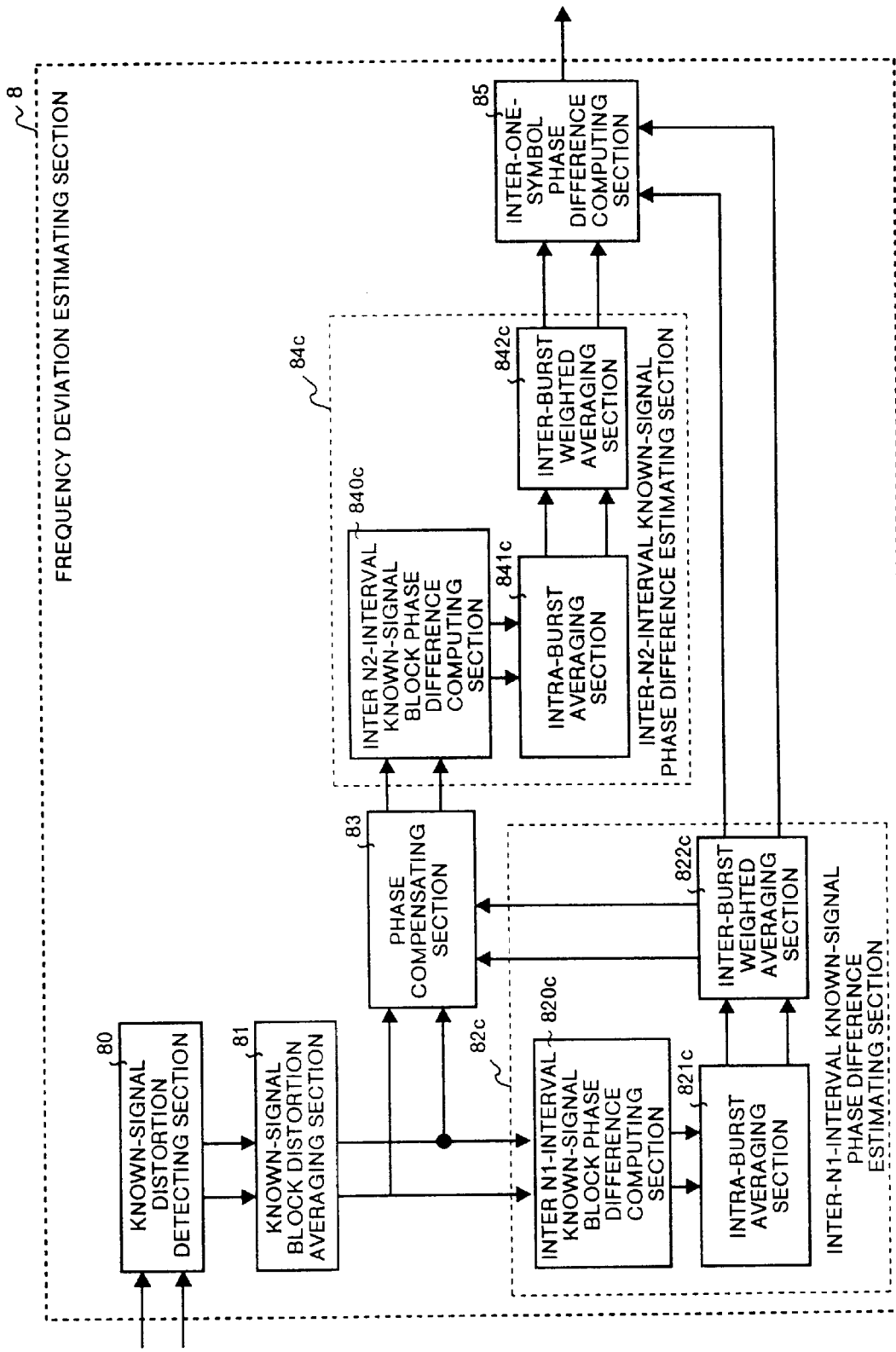
FIG. 12 is a view showing an example of configuration of the frequency deviation estimating section 8 according to Embodiment 6 of the present invention.

FIG. 12 is a view showing an example of configuration of the frequency deviation estimating section 8 according to Embodiment 6 of the present invention, and has a configuration which is different from the one explained in Embodiments 1 to 5. In FIG. 12, designated at the reference numeral 80 is a known-signal distortion detecting section, designated at 81 is a known-signal block distortion averaging section, designated at 82c is a inter-N1-interval known-signal phase difference estimating section, designated at 820c is a inter-N1-interval known-signal block phase difference computing section, designated at 821c is a intra-burst averaging section, designated at 822c is a inter-burst weight averaging section, designated at 84c is a inter-N2-interval known-signal phase difference estimating section, designated at 840c is a inter-N2-interval known-signal block phase difference computing section, designated at 841c is a intra-burst averaging section, designated at 842c is a inter-burst weight averaging section, and designated at 85 is a inter-one-symbol phase difference computing section. In the description hereinafter, the same reference numerals are assigned to components corresponding to those in Embodiment 1, 2, 3, 4 or 5, namely the transmitter and a portion of the receiver therein, and description thereof is omitted herein.

Figure 2:
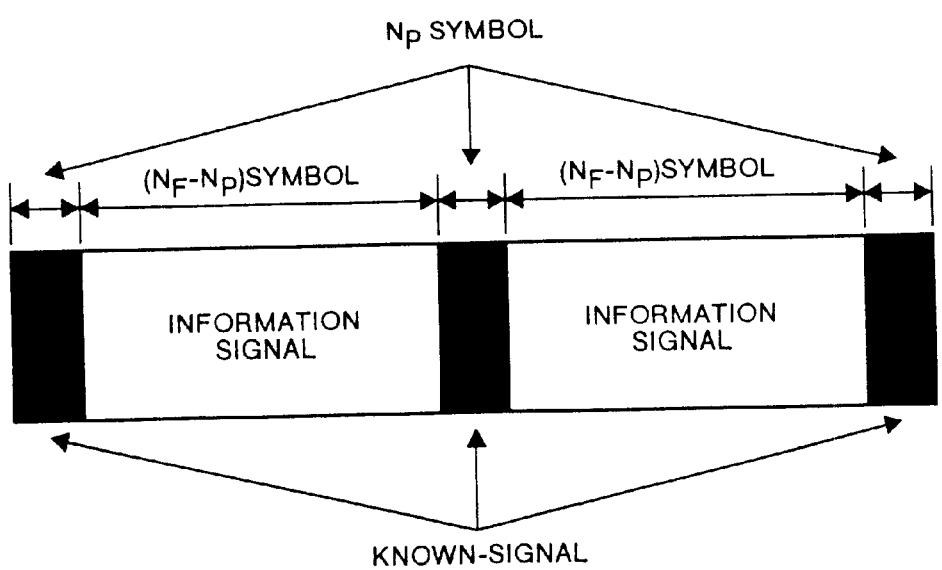
FIG. 2 is a view showing a format of an outgoing signal in which a known signal of $N_P$ symbols is periodically inserted.
Figure 13:
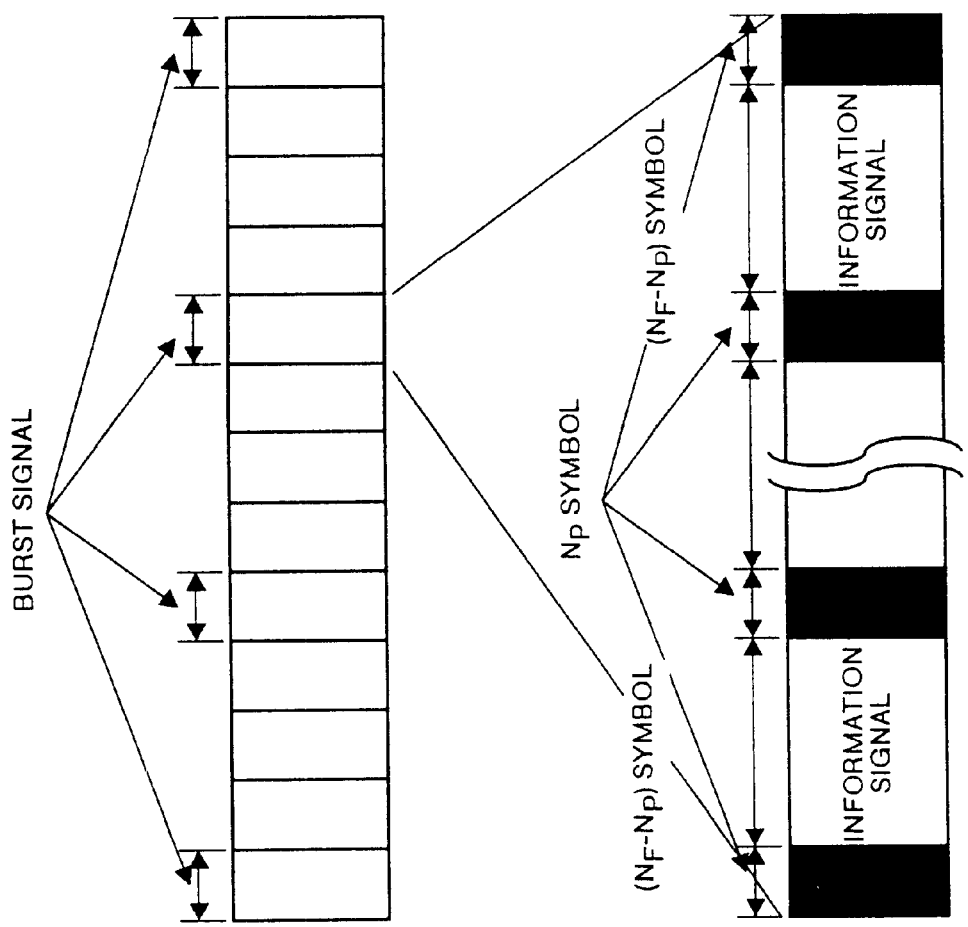
FIG. 13 is a view showing a format of a burst signal in TDMA with a known signal of $N_P$ symbols periodically inserted therein.

Operations of the frequency deviation estimating section 8 according to Embodiment 6 are explained here. The components other than the frequency deviation estimating section 8 constituting the receiver according to Embodiment 6 are the same as those in the receiver having been described in Embodiment 1, so that description of the same components is omitted herein, and the processing of removing a frequency deviation will be described by using the frequency deviation estimating section 8 in FIG. 12 in which the processing is different therefrom. In this embodiment as shown in FIG. 2, an outgoing signal into which known signals are periodically inserted is transmitted or received as a burst signal in TDMA (Time Division Multiple Access) as shown in FIG. 13.

At first, an inter-N1-interval known-signal phase difference estimating section 82c estimates a phase difference vector between known signals from the average $c_{EP}(kN_F)$ of fading distortions in a known signal block outputted from a known-signal block distortion averaging section 81. Namely, the inter-N1-interval known-signal block phase difference computing section 820c computes a phase difference vector from the average $c_{EP}(kN_F)$ of fading distortions in a known signal block as well as from an average $c_{EP}(kN_F+N1)$ of fading distortions between known signal blocks with an interval of N1 therebetween. The value of N1 is, for instance, equal to $N_F$, namely equal to the insertion interval of a known signal block. Therefore in this case, a phase difference vector $D_{EP1}(kN_F)$ can be computed as expressed by the Equation (12) similarly to Embodiment 1.

The intra-burst averaging section 821c computes, as expressed by the equation (38), the average $<D_{EP1}>$ of the burst of phase difference vectors $D_{EP1}(kN_F)$ between known signals with an interval of N1 outputted from the inter-N1-interval known-signal block phase difference computing section 820c.

$$\langle D_{EP1}\rangle = \frac{1}{M-1}\sum_{i=0}^{M-2} D_{EP1}(iN_F) \tag{38}$$

Here M indicates a number of known signal blocks inserted into the burst.

Then the inter-burst weighted averaging section 822c provides a weighted average to the bursts by using an average $<D_{EP1}>$ in a burst of phase difference vectors outputted from the intra-burst averaging section 821c to compute a result $<D_{EP1}>_B$ of the averaging as expressed by the equation (39).

$$(D_{EP1})_B=(D_{EP1})+\lambda_1(D_{EP1})_{B-1} \tag{39}$$

Where $\lambda_1$ indicates a parameter called forgetting factor when weighted averaging is performed and there is a relation $0 \leq \lambda_1 \leq 1$. Further, B indicates a burst number.

The inter-N1-interval known-signal phase difference estimating section 82c estimates a phase difference vector between known signals, and then the phase compensating section 83 executes phase compensation, as expressed by the equation (40), by using the average $c_{EP}(kN_F)$ of fading distortions in a known signal block and the average $<D_{EP1}>_B$ of phase difference vectors between known signal blocks with an interval of N1.

$$c_{EP1}(kN_F)=c_{EP}(kN_F)\exp(-j\theta_1(kN_F)), \ 0\leq k\leq M-1$$

$$\theta_1(kN_F)=\theta_1((k-1)N_F)+\theta_{EP,B} \tag{40}$$

$$\theta_{EP,B} = \tan^{-1}\frac{Im[\langle D_{EP1}\rangle_B]}{Re[\langle D_{EP1}\rangle_B]}$$

After phase compensation is executed, the inter-N2-interval known-signal phase difference estimating section 84c further estimates a phase difference vector between remaining known signals by using a fading distortion $c_{EP1}(kN_F)$ in a known-signal block outputted from the phase compensating section 83. Namely, the inter-N2-interval known-signal block phase difference computing section 840c computes a phase difference vector from the fading distortion $c_{EP1}(kN_F)$ in the known signal block after phase compensation as well as from an average $c_{EP1}(kN_F+N2)$ of fading distortions between known signal blocks with an interval of N2. The value of N2 is, for instance, $L*N_F$, namely an interval of symbols L (L≦2) times longer than the insertion interval of a known signal block. Therefore in this case, a phase difference vector $D_{EP2}(kN_F)$ can be computed as expressed by the equation (15) similarly to Embodiment 1.

Furthermore, the intra-burst averaging section 841c computes, as expressed by the equation (41), the average $<D_{EP2}>$ in a burst of phase difference vectors $D_{EP2}(kN_F)$ between known signal blocks with an interval of N2.

$$\langle D_{EP2} \rangle = \frac{1}{M-L} \sum_{i=0}^{M-L-1} D_{EP2}(iN_F) \quad (41)$$

Then, the inter-burst weighted averaging section 842c provides weighted average over bursts by using the average $<D_{EP2}>$ in a burst of phase difference vectors to compute a result $<D_{EP2}>_B$ of the averaging as expressed by the equation (42).

$$(D_{EP2})_B = (D_{EP2}) + \lambda_2 (D_{EP2})_{B-1} \quad (42)$$

Where $\lambda_2$ indicates a parameter called as a forgetting factor when weighted averaging is performed and there is a relation $0 \leq \lambda_2 \leq 1$. Further, B indicates a burst number.

The inter-N2-interval known-signal phase difference estimating section 84c estimates a phase difference vector, and then the inter-one-symbol phase difference computing section 85 computes, as expressed by the equation (43), a phase difference $\theta_S$, B in one symbol from an average $<D_{EP1}>$ of phase difference vectors outputted from the inter-N1-interval known-signal phase difference estimating section 82c as well as from the average $<D_{EP2}>$ of phase difference vectors outputted from the inter-N2-interval known-signal phase difference estimating section 84c.

$$\theta_{S,B} = \frac{\theta_{EP1}}{N_F} + \frac{\theta_{EP2}}{LN_F} \quad (43)$$

$$\theta_{EP1} = \tan^{-1} \frac{Im[\langle D_{EP1} \rangle_B]}{Re[\langle D_{EP1} \rangle_B]}$$

$$\theta_{EP2} = \tan^{-1} \frac{Im[\langle D_{EP2} \rangle_B]}{Re[\langle D_{EP2} \rangle_B]}$$

As described above, in this embodiment, the inter-burst averaging sections 821c, 841c execute average processing of phase difference vectors for a burst signal in TDMA, and further the inter-burst weighted averaging sections 822c, 842c execute average processing of phase difference vectors over bursts and appropriately selects a value of a forgetting factor as a parameter for the weighted averaging. Therefore, an estimation error for phase fluctuation due to fading as well as for a frequency deviation affected by noises or the like can be reduced.

Furthermore, in this embodiment, the inter-N1-interval known-signal phase difference estimating section 82 and inter-N2-interval known-signal phase difference estimating section 84 in Embodiment 1 have been replaced with the inter-N1-interval known-signal phase difference estimating section 82c and inter-N2-interval known-signal phase difference estimating section 84c respectively, and by performing the same replacement as described above for the components in, for instance, Embodiment 2 and Embodiment 4, the same effect can be obtained.

Figure 14:
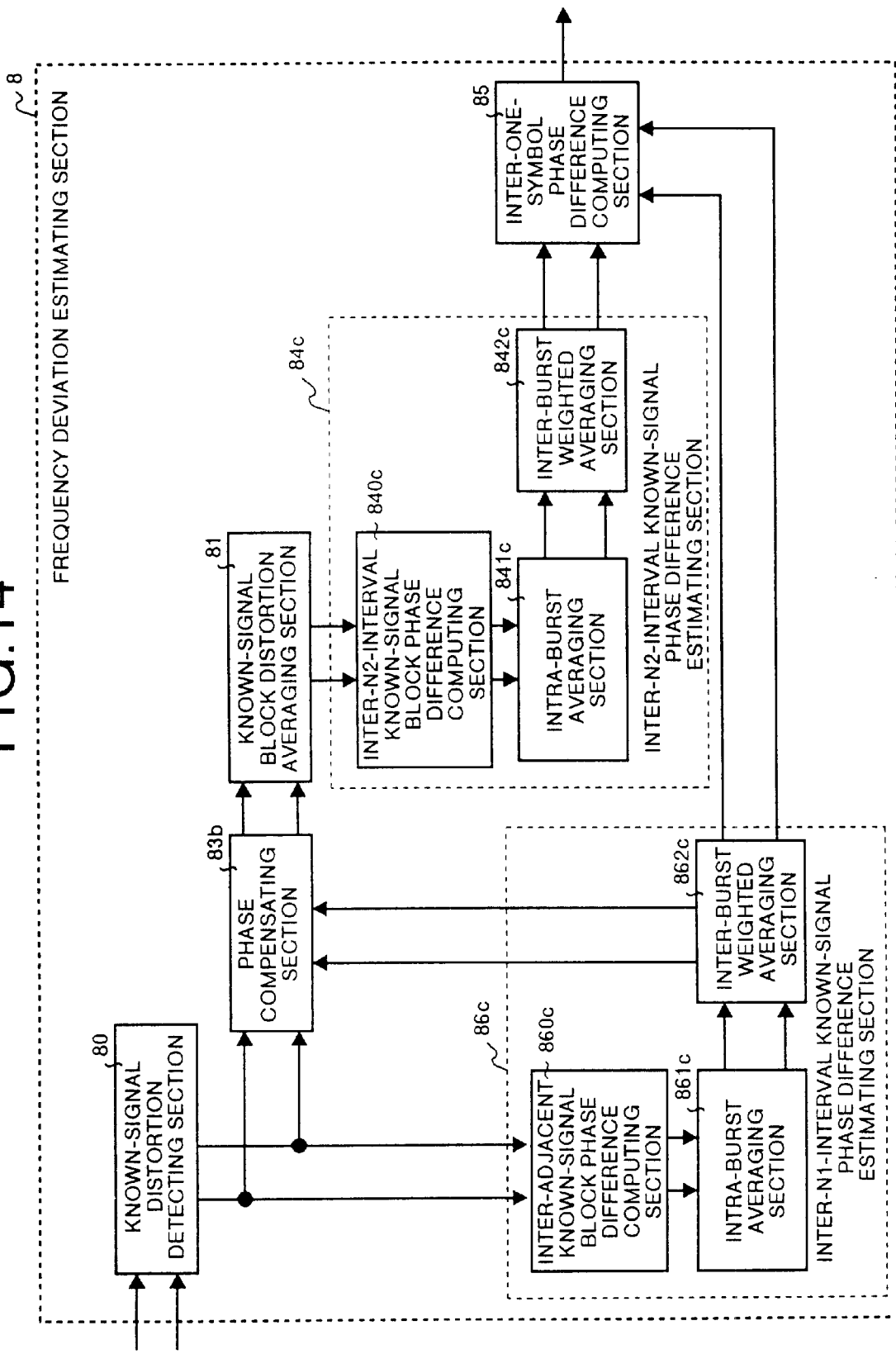
FIG. 14 is a view showing an example of configuration of the frequency deviation estimating section 8 according to Embodiment 7 of the present invention.

FIG. 14 is a view showing an example of configuration of the frequency deviation estimating section 8 according to Embodiment 7 of the present invention, and has a configuration which is different from the one explained in Embodiments 1 to 6. In FIG. 14, designated at the reference numeral 80 is a known-signal distortion detecting section, designated at 86cis a inter-adjacent known-signal phase difference estimating section, designated at 860c is a inter-adjacent known-signal phase difference computing section, designated at 861c is a intra-burst averaging section, at 862c is a inter-burst weighted averaging section, designated at 84c is a inter-N2-interval known-signal phase difference estimating section, designated at 840c is a inter-N2-interval known-signal block phase difference computing section, designated at 841c is a intra-burst averaging section, designated at 842c is a inter-burst weighted averaging section, and designated at 85 is a inter-one-symbol phase difference computing section. In the description hereinafter, the same reference numerals are assigned to components corresponding to those in Embodiment 1, 2, 3, 4, 5 or 6, namely the transmitter and a portion of the receiver therein, and description thereof is omitted herein.

Detailed description is made hereinafter for operations of the frequency deviation estimating section 8 according to Embodiment 7. The components other than the frequency deviation estimating section 8 constituting the receiver according to Embodiment 7 are the same as those in the receiver having been described in Embodiment 1, so that description of the same components is omitted herein, and the processing of removing a frequency deviation will be described by using the frequency deviation estimating section 8 in FIG. 14 in which the processing is different therefrom. In this embodiment, as shown in FIG. 13, an outgoing signal into which known signals are periodically inserted is transmitted or received as a burst signal in TDMA (Time Division Multiple Access) as shown in FIG. 13.

At first, an inter-adjacent known-signal phase difference estimating section 86c detects a phase difference vector between adjacent known signals from a fading distortion $c_{EPi}(kN_F+i)$, $0 \leq i \leq N_F-1$ in a known signal outputted from a known-signal distortion detecting section 80. Namely, an inter-adjacent known-signal phase difference computing section 860 computes a phase difference vector between adjacent signals in the fading distortion $c_{EPi}(kN_F+i)$, $0 \leq i \leq N_F-1$, in a known signal outputted from the known-signal distortion detecting section 80. The phase difference vector $D_{EP1}(kN_F+i)$, $0 \leq i \leq N_F-1$, can be computed as expressed by the Equation (25) similarly to Embodiment 3.

The intra-burst averaging section 861c computes, as expressed by the equation (44), the average $<D_{EP1}>$ in a burst of the phase difference vectors $D_{EP1}(kN_F+i)$, $0 \leq i \leq N_F-2$ between adjacent signals outputted from an inter-adjacent known-signal phase difference computing section 860.

$$\langle D_{EP1} \rangle = \frac{1}{M-1} \sum_{k=0}^{M-2} \left( \frac{1}{N_P-1} \sum_{i=0}^{N_P-2} D_{EP1}(kN_F + i) \right) \quad (44)$$

Here M indicates a number of known signal blocks inserted into a burst.

Then the inter-burst weighted averaging section 862c executes weighted averaging over bursts by using the average $<D_{EP1}>$ in a burst of phase difference vectors outputted from the intra-burst averaging section 861c to compute a result $<D_{EP1}>_B$ of the averaging as expressed by the equation (39) similarly to Embodiment 6.

The inter-adjacent known-signal phase difference estimating section 86c detects a phase difference vector between adjacent known signals, and then the phase compensating section 83 executes phase compensation, as expressed by the Equation (45), by using a fading distortion $c_{EPi}(kN_F+i)$, $0 \leq i \leq N_F-1$ in a known signal outputted from the known-signal distortion detecting section 80 and an average $<D_{EP1}>_B$ of phase difference vectors between adjacent signals outputted from the inter-adjacent known-signal phase difference estimating section 86c.

$$c_{EPi1}(kN_F+i) = c_{EPi}(kN_F+i)\exp(-j\theta_1(kN_F+i)), \ 0 \leq k \leq M-1,$$
$$0 \leq i \leq N_P-1$$

$$\theta_1(kN_F+i) = \theta_1(kN_F+i-1) + \theta_{EP,B} \quad (45)$$

$$\theta_{EP,B} = \tan^{-1} \frac{Im[\langle D_{EPI}\rangle_B]}{Re[\langle D_{EPI}\rangle_B]}$$

After phase compensation is executed, the known-signal block distortion averaging section 81 executes averaging of a fading distortion $c_{EPi1}(kN_F+i)$, $0 \leq i \leq N_F-1$ in a known symbol detected from the phase compensating section 83 as expressed by the Equation (29) similarly to Embodiment 3.

After averaging, the inter-N2-interval known-signal phase difference estimating section 84c further estimates a phase difference vector between remaining known signals by using the average $c_{EP1}(kN_F)$ of fading distortions in a known signal block outputted from the known-signal block distortion averaging section 81. Namely, the inter-N2-interval known-signal block phase difference computing section 840c computes a phase difference vector from the average $c_{EP1}(kN_F)$ of fading distortions in a known signal block outputted from the known-signal block distortion averaging section 81 as well as from an average $c_{EP1}(kN_F+N2)$ of fading distortions between known signal blocks with an interval of N2 therebetween. The value of N2 is, for instance, $L*N_F$, namely an interval of symbols which is L ($L \geq 1$) times larger than the insertion interval of a known signal block. Therefore in this case, a phase difference vector $D_{EP2}(kN_F)$ can be computed as expressed by the equation (15) similarly to Embodiment 3.

The intra-burst averaging section 841c computes, as expressed by the equation (46), the average $<D_{EP2}>$ in a burst of phase difference vectors $D_{EP2}(kN_F)$ between known signals with an interval of N2 outputted from the inter-N2-interval known-signal block phase difference computing section 840c.

$$\langle D_{EP2}\rangle = \frac{1}{M-L} \sum_{k=0}^{M-L-1} D_{EP2}(kN_F) \quad (46)$$

Here M indicates a number of known signal blocks inserted into a burst.

Then the inter-burst weighted averaging section 842c executes weighted averaging with respect to the bursts by using the average $<D_{EP2}>$ in a burst of phase difference vectors outputted from the intra-burst averaging section 841c to compute a result $<D_{EP2}>_B$ of the averaging as expressed by the equation (42) similarly to Embodiment 6.

Finally, the inter-one-symbol phase difference computing section 85 computes, as expressed by the equation (37), a phase difference $\theta_S$ in one symbol from the average $<D_{EP1}>_B$ of phase difference vectors outputted from the inter-adjacent known-signal phase difference estimating section 86c as well as from the average $<D_{EP2}>_B$ of phase difference vectors outputted from the inter-N2-interval known-signal phase difference estimating section 84c.

$$\theta_S = \theta_{EP1} + \frac{\theta_{EP2}}{LN_F} \quad (47)$$

$$\theta_{EP1} = \tan^{-1} \frac{Im[\langle D_{EP1}\rangle_B]}{Re[\langle D_{EP1}\rangle_B]}$$

$$\theta_{EP2} = \tan^{-1} \frac{Im[\langle D_{EP2}\rangle_B]}{Re[\langle D_{EP2}\rangle_B]}$$

As described above, in this embodiment, the intra-burst averaging sections 861c, 841c execute average processing with respect to phase difference vectors for a burst signal in TDMA, and further the inter-burst weighted averaging sections 862c, 842c execute average processing of phase difference vectors with respect to bursts and appropriately selects the value of the forgetting factor as a parameter for weight averaging. With this operation, an estimation error for phase fluctuation due to fading as well as for a frequency deviation affected by noises or the like can be reduced.

Further, the inter-adjacent known-signal phase difference estimating section 86 and inter-N2-interval known-signal phase difference estimating section 84 in Embodiment 3 have been replaced with the inter-adjacent known-signal phase difference estimating section 86c and inter-N2-interval known-signal phase difference estimating section 84c respectively, and by performing the same replacement as described above for the components in, for instance, Embodiment 5, the same effect can also be obtained.

Figure 15:
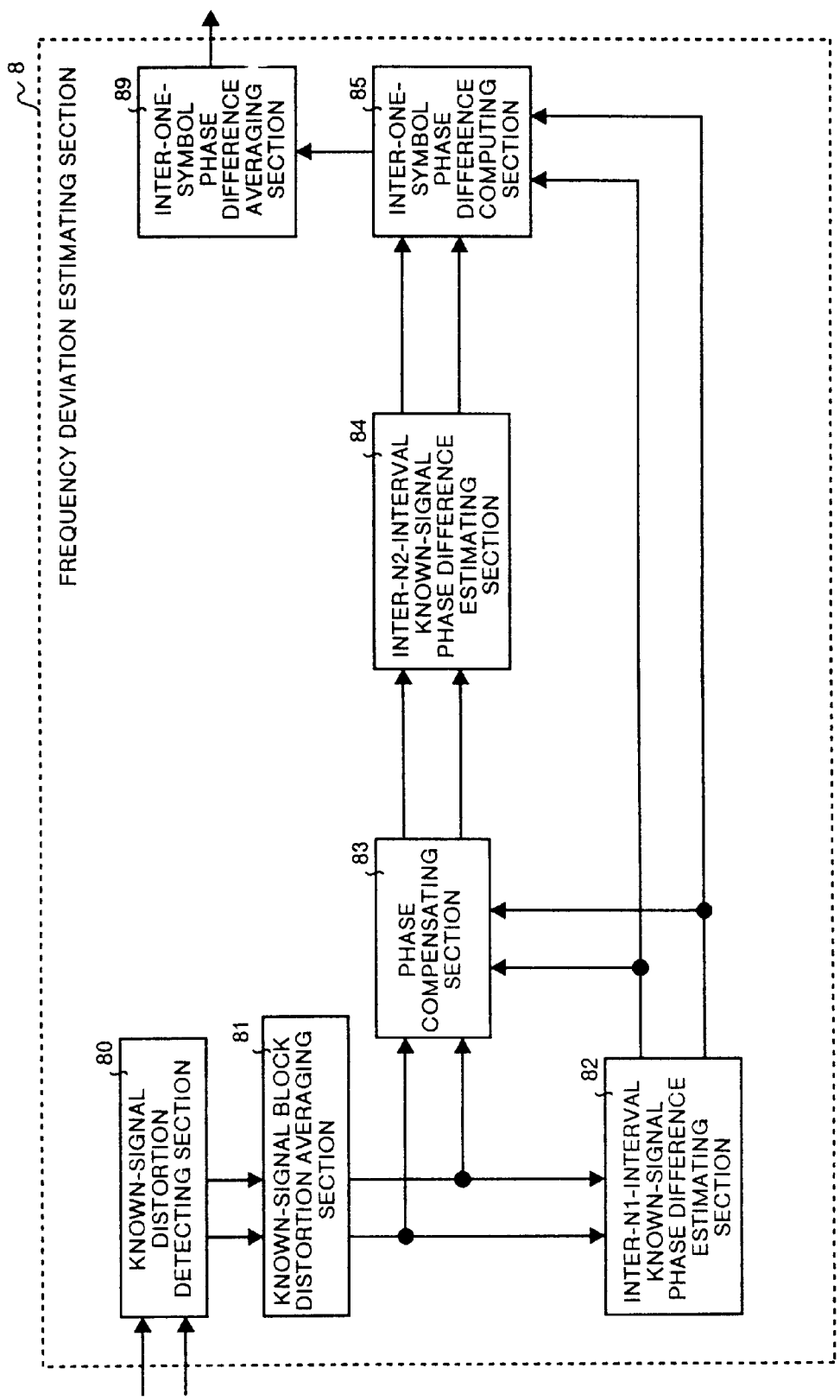
FIG. 15 is a view showing an example of the configuration of the frequency deviation estimating section 8 according to Embodiment 8 of the present invention.

FIG. 15 is a view showing an example of configuration of the frequency deviation estimating section 8 according to Embodiment 8 of the present invention, and has a configuration which is different from the one explained in Embodiments 1 to 7. In FIG. 15, designated at the reference numeral 80 is a known-signal distortion detecting section, designated at 81 is a known-signal block distortion averaging section, designated at 82 is a inter-N1-interval known-signal phase difference estimating section, designated at 84 is a inter-N2-interval known-signal phase difference estimating section, designated at 85 is a inter-one-symbol phase difference computing section, and designated at 89 is a inter-one-symbol phase difference averaging section. In the description hereinafter, the same reference numerals are assigned to components corresponding to those in Embodiment 1, 2, 3, 4, 5, 6 or 7, namely the transmitter and a portion of the receiver therein, and description thereof is omitted herein.

Operations of the frequency deviation estimating section 8 according to Embodiment 8 are explained below.

The inter-one-symbol phase difference averaging section 89 executes averaging processing with respect to a phase difference $\theta_S(kN_F)$ in one symbol outputted from the inter-one-symbol phase difference computing section 85 as expressed, for instance, by the equation (48).

$$\langle \theta_S(kN_F)\rangle = \frac{1}{2M+1} \sum_{k=-M}^{M} \theta_S(kN_F) \quad (48)$$

As described above, in this embodiment, the inter-one-symbol phase difference averaging section 89 is provided in the upstream side from the inter-one-symbol phase difference computing section 85. With this feature, an estimation error for phase fluctuation due to fading as well as for a frequency deviation affected by noise or the like can further be reduced. In this embodiment, although the inter-one-symbol phase difference averaging section 89 is added a new in the configuration according to Embodiment 1, the same effect can be obtained if this inter-one-symbol phase difference averaging section 89 is provided in configuration according to any of the Embodiments 2 to 7.

Figure 16:
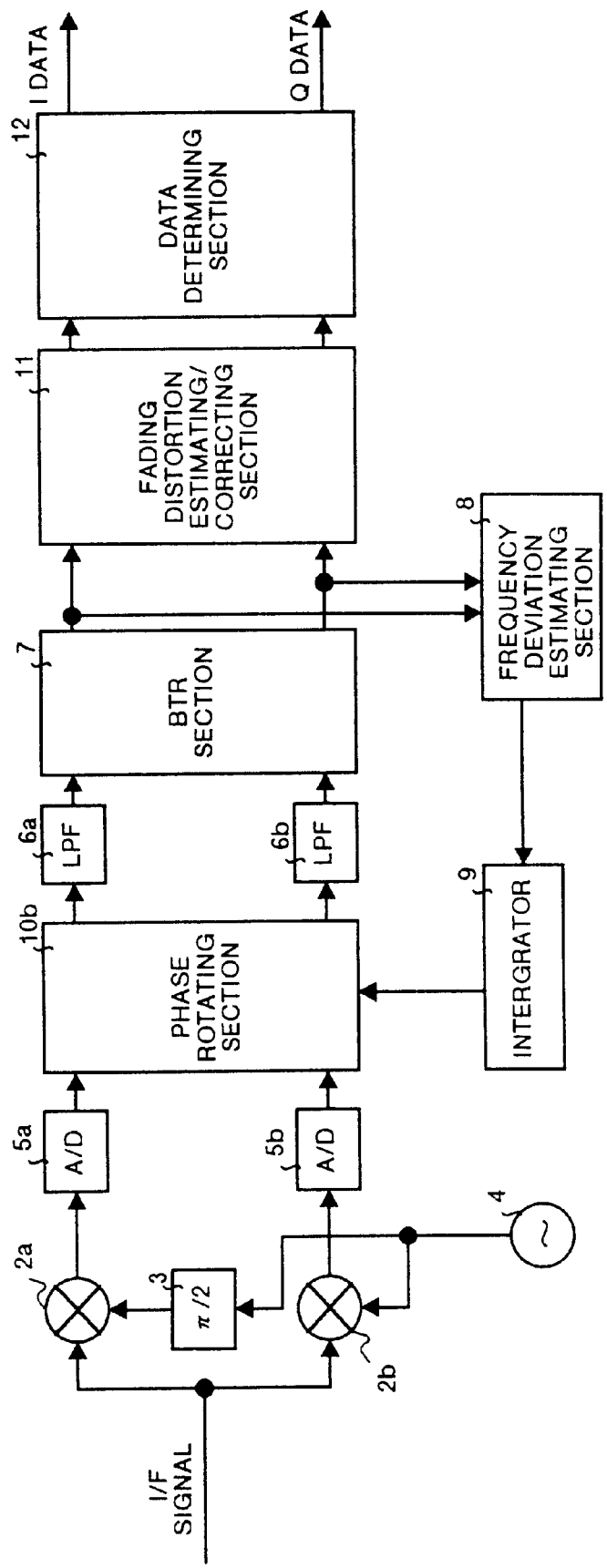
FIG. 16 is a block view showing configuration of a receiver according to Embodiment 9 of the present invention for removing a frequency deviation.

FIG. 16 is a block diagram showing configuration of a receiver for the automatic frequency control apparatus according to the present invention, and has a configuration which is different from the one explained in FIG. 3. Namely, this figure shows Embodiment 9 of the receiver which receives an outgoing signal from the above mentioned transmitter and eliminates the frequency deviation by using known signals periodically inserted into this outgoing signal. In FIG. 16, designated at the reference numeral 2a, 2b are multipliers, designated at 3 is a π/2 phase shifter, designated at 4 is an oscillator, designated at 5a, 5b are A/D converters, designated at 10b is a phase rotating section, designated at 6a, 6b are LPFs, designated at 7 is a BTR section, designated at 8 is a frequency deviation estimating section, designated at 9 is an integrator, designated at 11 is a fading distortion estimating/compensating section, and designated at 12 is a data determining section.

Operations of the receiver shown in FIG. 16 are explained below. The receiver according to Embodiment 9 for removing a frequency deviation included in an incoming signal using known signals inserted into an outgoing signal is configured by locating the phase rotating section 10 shown in FIG. 3 in a previous stage of the LPFs 6a, 6b, and the components other than the section 10 are the same as those in Embodiments 1 to 8, so that the same reference numerals are assigned thereto and description thereof is omitted herein.

At first, the oscillator 4 outputs a sinusoidal signal having a frequency substantially equivalent to a carrier frequency of an incoming I/F signal. The π/2 phase shifter 3 shifts a phase of the sinusoidal signal outputted from the oscillator 4 by π/2 radians. Then the multiplier 2a multiplies the incoming I/F signal and the sinusoidal signal outputted from the π/2 phase shifter 3, and outputs an analog baseband signal in an I-channel. On the other hand, the multiplier 2b multiplies the incoming I/F signal and the sinusoidal signal outputted from the oscillator 4, and outputs an analog baseband signal in a Q-channel.

Then, the A/D converters 5a, 5b sample the analog baseband signals r(t) in the I and Q-channel at prespecified time interval, convert the amplitude of the sampled signals to digital values, and output the converted signals as digital baseband signals in I and Q-channel.

After the A/D conversion, the phase rotating section 10b executes phase rotation to the digital baseband signals in the I and Q-channel for each one symbol by using an integrated value of phase differences in one symbol computed by the integrator 9, and removes a frequency deviation. Then, the LPFs 6a, 6b execute filtering processing as waveform shaping by a Nyquist filter or the like with respect to the digital baseband signals in the I and Q-channel after removal of the frequency deviation outputted from the phase rotating section 10b. After the filtering processing, the BTR section 7 detects each Nyquist point from the digital baseband signals in the I and Q-channel outputted from the LPFs 6a, 6b, and outputs the digital baseband signals in the I and Q-channel corresponding to each Nyquist point.

The frequency deviation estimating section 8 detects a frequency deviation from the digital baseband signals in the I and Q-channel corresponding to the Nyquist points outputted from the BTR section 7. The integrator 9 executes integration processing by means of iterative addition of one-symbol cycles by using a phase difference in one symbol outputted from the frequency deviation estimating section 8.

The fading distortion estimating/compensating section 11 removes a distortion of a signal caused by fading or the like from the digital baseband signals in the I and Q-channel outputted from the BTR section 7. Finally, the data determining section 12 determines outgoing data according to the I-channel and Q-channel digital baseband signals having been subjected to compensation for fading distortion outputted from the fading distortion estimating/compensating section 11.

As described above, in this embodiment, the phase rotating section 10b is located in the previous stage of the LPFs 6a, 6b. With this feature, even when a frequency deviation becomes larger as compared to a cutoff frequency of the LPF, the frequency deviation can be removed without cutting off a portion of the signal power. As for the configuration of the frequency deviation estimating section 8, any configuration in Embodiments 1 to 8 may be used to obtain the same effect as described above.

Figure 17:
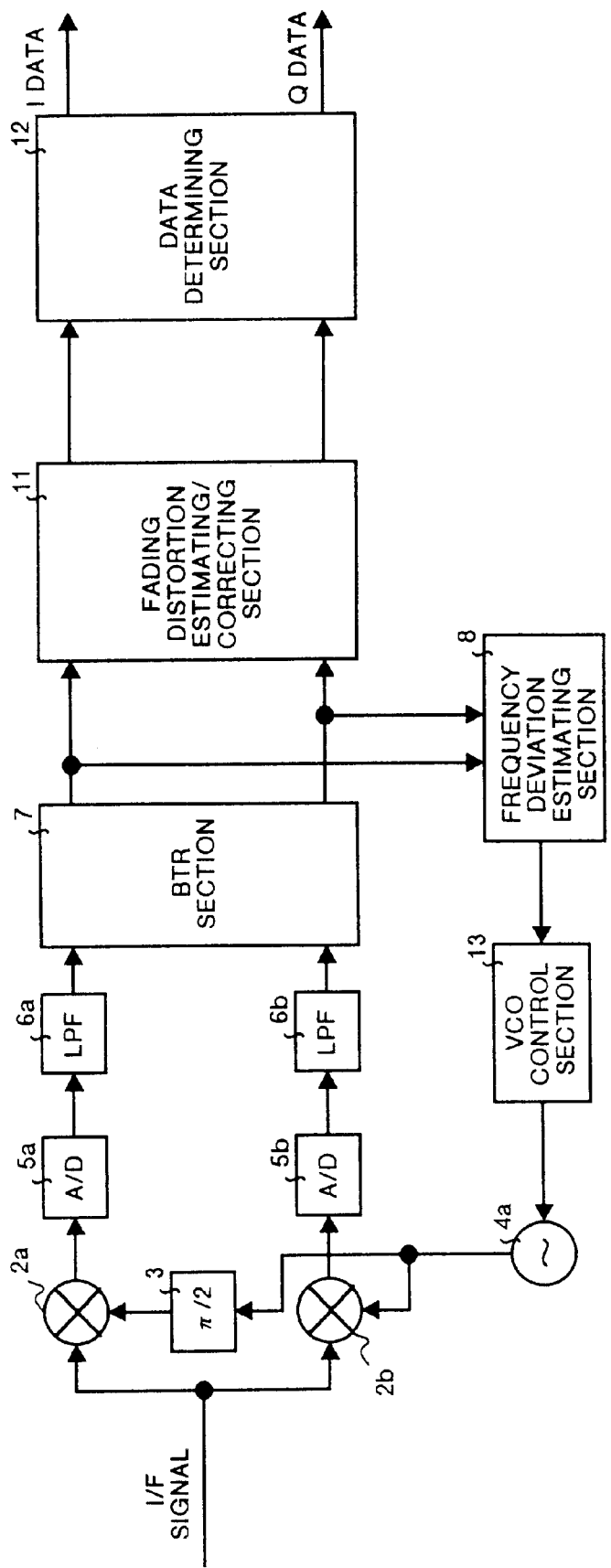
FIG. 17 is a block diagram showing a receiver according to Embodiment 10 of the present invention for removing a frequency deviation.

FIG. 17 is a block diagram showing configuration of a receiver for the automatic frequency control apparatus according to the present invention which is different from the one shown in FIG. 3 or FIG. 16. Namely, this figure shows Embodiment 10 of a receiver which receives an outgoing signal from the above mentioned transmitter and removes a frequency deviation by using known signals periodically inserted into the outgoing signal. In FIG. 17, designated at the reference numeral 2a, 2b are multipliers, designated at 3 is a π/2 phase shifter, designated at 4a is a VCO (Voltage Controlled Oscillator), designated at 5a, 5b are A/D converters, designated at 6a, 6b are LPFs, designated at 7 is a BTR section, designated at 8 is a frequency deviation estimating section, designated at 13 is a VCO control section, designated at 11 is a fading distortion estimating/compensating section, and designated at 12 is a data determining section.

Operations of the receiver shown in FIG. 17 are explained here. The receiver according to Embodiment 10 for removing a frequency deviation included in an incoming signal using known signals inserted into an outgoing signal is configured by providing the VCO control section 13 in place of the integrator 9 and phase rotating section 10 shown in FIG. 3, and the components other than this VCO control section 13 are the same as those in Embodiments 1 to 8, so that the same reference numerals are assigned thereto and description thereof is omitted herein.

At first, the VCO 4a controlled by the VCO control section 13 described later outputs a sinusoidal signal having a frequency substantially equivalent to a carrier frequency of the incoming I/F signal. The π/2 phase shifter 3 shifts a phase of the sinusoidal signal outputted from the VCO 4a by π/2 radian. Then the multiplier 2a multiplies the incoming I/F signal and the sinusoidal signal outputted from the π/2 phase shifter 3, and outputs an analog baseband signal in the I-channel. On the other hand, the multiplier 2b multiplies the incoming I/F signal and the sinusoidal signal outputted from the VCO 4a to output an analog baseband signal in the Q-channel.

Then the A/D converters 5a, 5b sample the analog baseband signals r(t) in the I and Q-channel at prespecified time interval, convert the amplitude of the sampled signals to digital values, and output the digital baseband signals in the I and Q-channel.

After the A/D conversion, the LPFs 6a, 6b execute filtering processing as waveform shaping by a Nyquist filter or the like to the digital baseband signals in the I and Q-channel outputted from the A/D converters 5a, 5b. After the filtering processing, the BTR section 7 detects each Nyquist point from the digital baseband signals in the I and Q-channel outputted from the LPFs 6a, 6b, and outputs the digital baseband signals in the I and Q-channel corresponding to each Nyquist point.

The frequency deviation estimating section 8 detects a frequency deviation from the digital baseband signals in the I and Q-channel corresponding to the Nyquist points outputted from the BTR section 7. The VCO control section 13 computes a value of the voltage for controlling the VCO 4a according to the frequency deviation outputted from the frequency deviation estimating section 8.

The fading distortion estimating/compensating section 11 removes a distortion of a signal caused by fading or the like from the digital baseband signals in the I and Q-channel outputted from the BTR section 7. Finally, the data determining section 12 determines outgoing data according to the I and Q-channel digital baseband signals having been subjected to compensation for fading distortion outputted from the fading distortion estimating/compensating section 11.

As described above, in this embodiment, the VCO control section 13 controls the VCO 4a according to the frequency deviation detected in the frequency deviation estimating section 8. With this feature, even when a frequency deviation becomes larger as compared to a cutoff frequency of the LPF, the frequency deviation can be removed without cutting off a portion of the signal power. As for the configuration of the frequency deviation estimating section 8, any configuration in Embodiments 1 to 8 may be used to obtain the same effect as described above.

Figure 18:
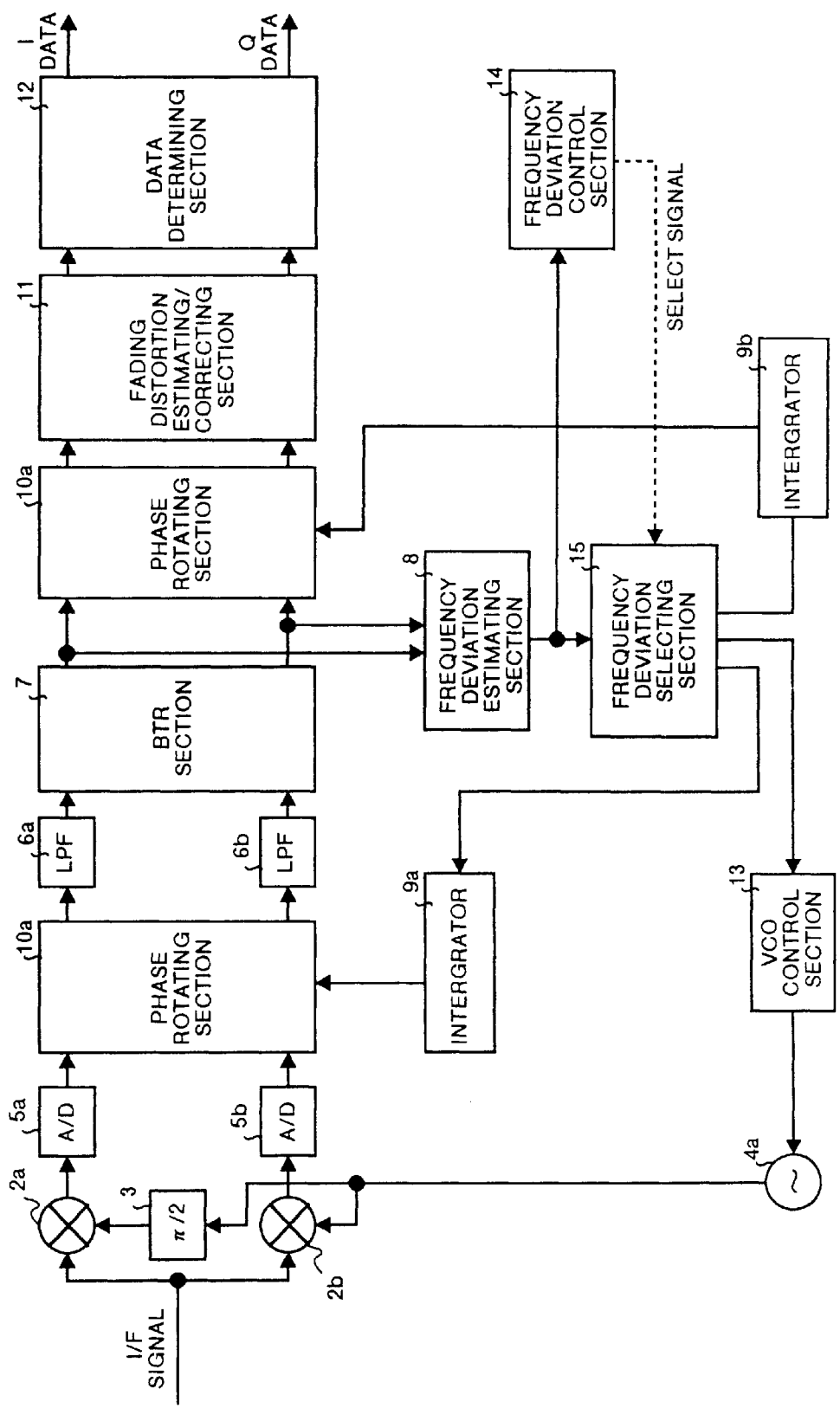
FIG. 18 is a block diagram showing configuration of a receiver according to Embodiment 11 of the present invention for removing a frequency deviation.
Figure 19:
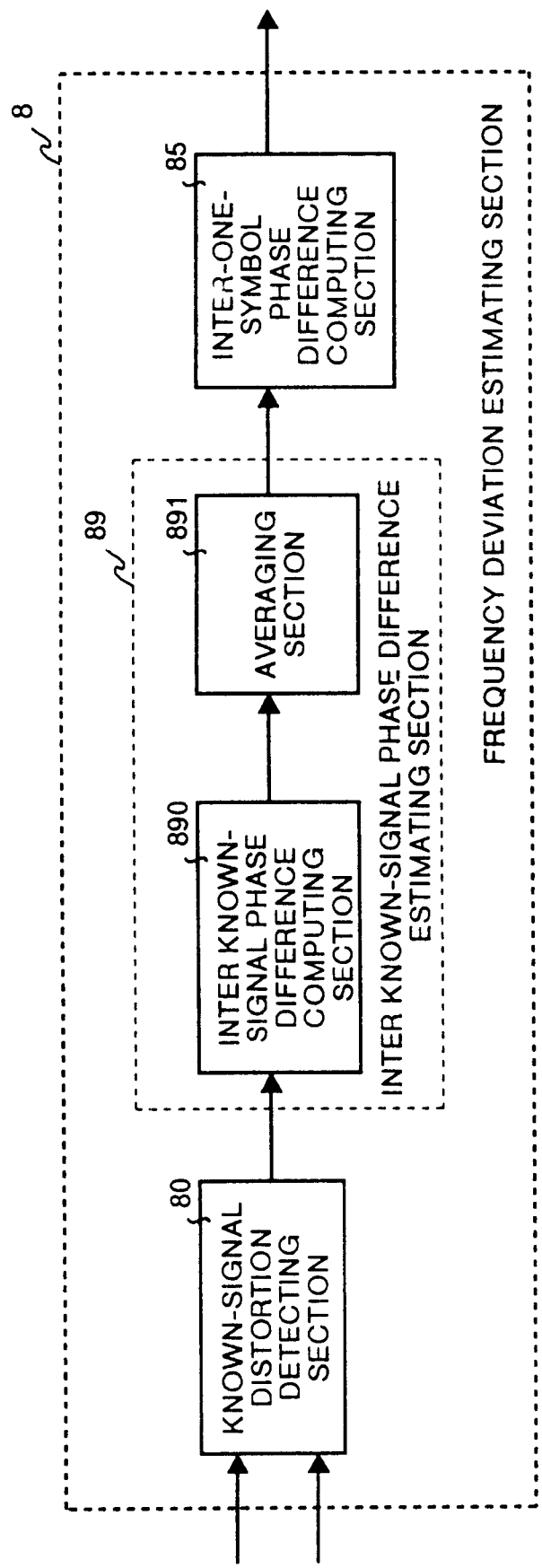
FIG. 19 is a view showing configuration of a conventional type of automatic frequency control apparatus.
Figure 20:
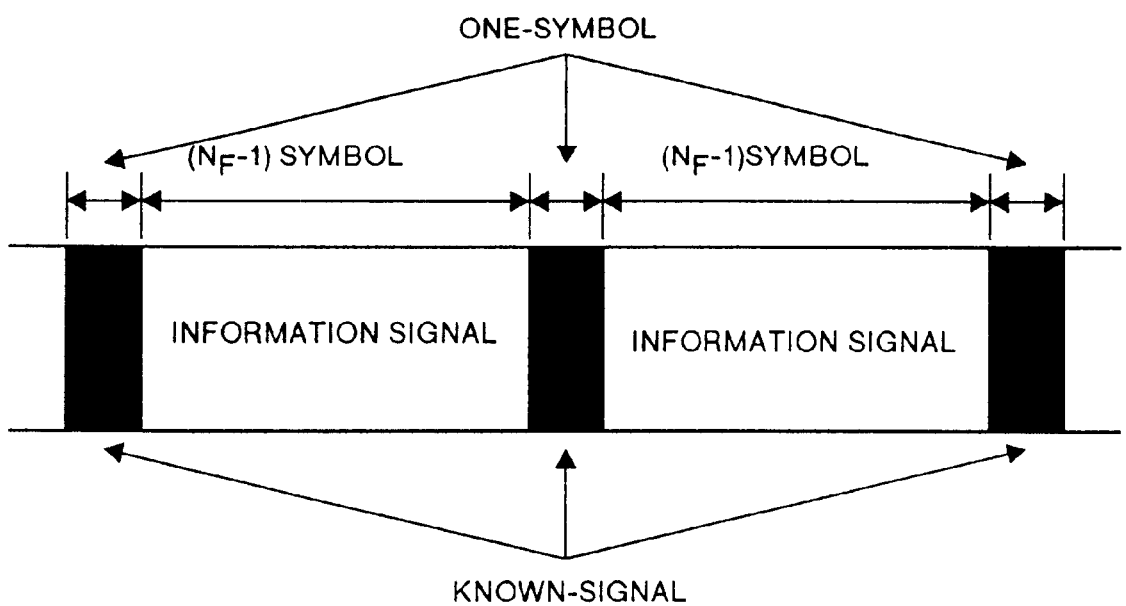
FIG. 20 is a view showing a format of an incoming signal in which a known signal of one-symbol has been periodically inserted.

FIG. 18 is a block diagram showing configuration of a receiver for the automatic frequency control apparatus according to the present invention which is different from the one shown in FIG. 3, FIG. 16 or FIG. 17. Namely, this figure shows Embodiment 11 of the receiver which receives an outgoing signal from the above mentioned transmitter and removes a frequency deviation by using known signals periodically inserted into the outgoing signal. In FIG. 18, designated at the reference numeral 2a, 2b are multipliers, designated at 3 is a π/2 phase shifter, designated at 4a is a VCO, designated at 5a, 5b are A/D converters, designated at 6a, 6b are LPFs, designated at 7 is a BTR section, designated at 8 is a frequency deviation estimating section, designated at 9a, 9b are integrators, designated at 10a is a phase rotating section, designated at 11 is a fading distortion estimating/compensating section, designated at 12 is a data determining section, designated at 13 is a VCO control section, designated at 14 is a frequency deviation control section, and designated at 15 is a frequency deviation selecting section.

Operations of the receiver shown in FIG. 18 are explained below. The receiver according to Embodiment 11 for removing a frequency deviation included in an incoming signal using known signals inserted into an outgoing signal is configured with all the components in FIG. 3, FIG. 16, and FIG. 17, so that the same reference numerals are assigned to the components corresponding to those in Embodiments 1 to 10, and description thereof is omitted herein.

At first, the VCO 4a controlled by the VCO control section 13 outputs a sinusoidal signal having a frequency substantially equivalent to a carrier frequency of an incoming I/F signal. The π/2 phase shifter 3 shifts a phase of the sinusoidal signal outputted from the VCO 4a by π/2 radian. Then the multiplier 2a multiplies the incoming I/F signal and the sinusoidal signal outputted from the π/2 phase shifter 3, and outputs an analog baseband signal in the I-channel. On the other hand, the multiplier 2b multiplies the incoming I/F signal and the sinusoidal signal outputted from the oscillator 4a and outputs an analog baseband signal in the Q-channel.

Then, the A/D converters 5a, 5b sample this analog baseband signals r(t) in the I and Q-channel at a prespecified time interval, convert the amplitude of the sampled signals to digital values, and output the digital baseband signals in the I and Q-channel.

After the A/D conversion, the phase rotating section 10a executes phase rotation to the digital baseband signals in the I and Q-channel for each one symbol by using an integrated value of phase differences in one symbol computed by the integrator 9a, and removes a frequency deviation. The LPFs 6a, 6b execute filtering processing as waveform shaping by a Nyquist filter or the like with respect to the digital baseband signals in the I and Q-channel outputted from the phase rotating section 10a. The BTR section 7 detects each Nyquist point from the digital baseband signals in the I and Q-channel outputted from the LPFs 6a, 6b, and outputs digital baseband signals in the I and Q-channel corresponding to each Nyquist point.

The frequency deviation estimating section 8 detects a frequency deviation from the digital baseband signals in the I and Q-channel corresponding to the Nyquist points outputted from the BTR section 7. Then the frequency deviation control section 14 provides controls for switching to control a frequency by using information for a frequency deviation outputted from the frequency deviation estimating section 8.

The frequency deviation selecting section 15 switches a frequency deviation by using a select signal outputted from the frequency deviation control section 14. For instance, when a frequency deviation at the time of initially capturing a signal is large, the frequency deviation control section 14 transmits a select signal to the frequency deviation selecting section 15 so as to control the VCO control section 13. After the frequency deviation is removed by the VCO control section 13, the integrator 9a and phase rotating section 10a remove a frequency deviation, or the integrator 9b and phase rotating section 10b remove a frequency deviation. On the other hand, when a result of detection of a frequency by the frequency deviation estimating section 8 becomes larger as compared to a cutoff frequency in the LPFs 6a, 6b, the frequency deviation control section 14 transmits a select signal to the frequency deviation selecting section 15 so as to select the integrator 9a, and in a case other than the above case, the frequency deviation control section 14 transmits a select signal to the frequency deviation selecting section 15 so as to select the integrator 9b. When a frequency deviation is switched, accumulated data for the averaging sections 821, 841 in the integrators 9a, 9b as well as in the frequency deviation estimating section 8 is reset.

As described above, in this embodiment, the VCO control section 13, integrator 9a, or integrator 9b is switched according to a frequency deviation detected in the frequency deviation estimating section 8. With this operation, even when a frequency deviation at the time of initially capturing a signal is large, the frequency deviation can be removed without cutting off a portion of the signal power by a cutoff frequency in a LPF.

Furthermore, in this embodiment, a switching control to a frequency deviation is provided according to information for a frequency deviation from the frequency deviation estimating section 8, so that an optimal frequency deviation according to the information for a frequency deviation can be removed. As for the configuration of the frequency deviation estimating section 8, any configuration in Embodiments 1 to 8 may be used to obtain the same effect as described above.

According to the present invention, a frequency deviation in one symbol is computed according to the frequency deviation in the first period estimated by the first phase difference estimating unit and the frequency deviation in the second period estimated by the second phase difference estimating unit. Therefore, a wide detection range for a frequency deviation in one of the phase difference estimating units and high precision in estimation of a frequency deviation in the other phase difference estimating unit can simultaneously be realized. In addition, with the present invention, a frequency deviation of a direct wave can be estimated with higher precision than that of the conventional system in a situation where a multi-path wave and a direct wave coexist like in the fading environment, and further accurate frequency control can be provided to a direct wave. The phase difference herein includes a meaning of information for a phase difference represented by a vector other than an ordinary phase difference θ.

According to the present invention, the distortion averaging unit executes the average processing, therefore an estimation error for phase fluctuation due to fading as well as for a frequency deviation affected by noise or the like can be reduced, and at the same time a frequency deviation between a transmitter and a receiver and frequency fluctuation caused due to the Doppler effect can be estimated with high precision.

According to the present invention, the first phase difference estimating unit located in the previous stage of the second phase difference estimating unit estimates a frequency deviation in N1, and after the frequency deviation is removed according to a result of the estimation, the second phase difference estimating unit further estimates a frequency deviation in N2, and the results of estimation of frequency deviations in both the phase difference estimating units are synthesized. Therefore, a wide detection range for a frequency deviation in the first phase difference estimating unit and high precision in estimation of a frequency deviation in the second phase difference estimating unit can simultaneously be realized. In addition, with the present invention, a frequency deviation of a direct wave can be estimated with higher precision than that of the conventional system in a situation where a multi-path wave and a direct wave coexist like in the Rician fading environment, and further accurate frequency control can be provided to a direct wave. By performing operation with only phases in the first phase difference estimating unit and the second phase difference estimating unit, removal processing of a frequency deviation can be realized by an apparatus with simple a configuration.

According to the present invention, the first phase difference estimating unit located in the previous stage of the second phase difference estimating unit estimates a frequency deviation between adjacent known signals, and after the frequency deviation is removed according to a result of the estimation, further, the second phase difference estimating unit estimates a frequency deviation in N2, and the results of estimation of the frequency deviation in both the phase difference estimating units are synthesized. Therefore, a wide detection range for a frequency deviation in the first phase difference estimating unit and high precision in estimation of a frequency deviation in the second phase difference estimating unit can simultaneously be realized. In addition, with the present invention, a frequency deviation of a direct wave can be estimated with higher precision even in a situation where a multi-path wave and a direct wave coexist like in the Rician fading environment, therefore accurate frequency control can be provided to a direct wave.

According to the present invention, the first phase difference estimating unit estimates a frequency deviation in N1 and the second phase difference estimating unit estimates a frequency deviation in N2 regardless of the order thereof, and a frequency deviation in one symbol is computed according to both of these frequency deviations. Therefore, for example, a wide detection range for a frequency deviation in the first phase difference estimating unit and high precision in estimation of a frequency deviation in the second phase difference estimating unit can simultaneously be realized.

According to the present invention, the phase difference selecting unit selects the first phase difference estimated by the first phase difference estimating unit or the phase difference estimated by the second phase difference estimating unit. Therefore, for example, a wide detection range for a frequency deviation in the first phase difference estimating unit or high precision in estimation of a frequency deviation in the second phase difference estimating unit can be selected.

According to the present invention, the first inter-symbol phase difference computing unit and the second inter-symbol phase difference computing unit are located behind the first phase difference estimating unit and second phase difference estimating unit respectively, each of them compute a phase difference in one symbol, and then the phase difference selecting unit selects either one of the outputs from the inter-symbol phase difference computing units. Therefore, for example, a wide detection range for a frequency deviation in the first phase difference estimating unit or high precision in estimation of a frequency deviation in the second phase difference estimating unit can be selected.

According to the present invention, the first phase difference estimating unit estimates a frequency deviation between adjacent known signals and the second phase difference estimating unit estimates a frequency deviation in N1 regardless of the order thereof, and a frequency deviation in one symbol is computed according to both of the frequency deviations. Therefore, for example, a wide detection range for a frequency deviation in the first phase difference estimating unit and high precision in estimation of a frequency deviation in the second phase difference estimating unit can simultaneously be realized.

According to the present invention, the phase difference selecting unit selects the first phase difference estimated by the first phase difference estimating unit or the phase difference estimated by the second phase difference estimating unit. Therefore, for example, a wide detection range for a frequency deviation in the first phase difference estimating unit or high precision in estimation of a frequency deviation in the second phase difference estimating unit can be selected.

According to the present invention, the first inter-symbol phase difference computing unit and the second inter-symbol phase difference computing unit are located behind the first phase difference estimating unit and second phase difference estimating unit respectively, each of them compute a phase difference in one symbol, and then the phase difference selecting unit selects either one of the outputs from the inter-symbol phase difference computing units. Therefore, for example, a wide detection range for a frequency deviation in the first phase difference estimating unit or high precision in estimation of a frequency deviation in the second phase difference estimating unit can be selected.

According to the present invention, average processing of phase differences in a burst is performed to a burst signal in TDMA, further average processing of phase differences over bursts is performed, and a value of a forgetting factor as a parameter in the weighted average is appropriately selected. Therefore, an estimation error for phase fluctuation due to fading as well as for a frequency deviation affected by noises or the like can be reduced.

According to the present invention, a phase difference in one symbol is computed, and average processing is executed to phase differences over symbols. Therefore, an estimation error for phase fluctuation due to fading as well as for a frequency deviation affected by noises or the like can further be reduced.

According to the present invention, as only the known signal is used for configuration thereof, a frequency deviation can be removed with simple processing, with which it is possible to realize improvement of receiver performance. In addition, with the present invention, as desired precision of estimation of a frequency can be obtained in a comparatively short period of time even in an environment with a low C/N, the tracking performance to time-dependent fluctuation in a frequency deviation caused by the Doppler effect or the like becomes excellent. With the present invention, a frequency deviation of a direct wave can be estimated with higher precision even in a situation where a multi-path wave and a direct wave coexist like in the Rician fading environment, therefore high-precision frequency control can be provided to a direct wave.

According to the present invention, a phase deviation is removed before waveform shaping is executed to a digital baseband signal by means of filtering processing. Therefore, even when a frequency deviation is larger as compared to a cutoff frequency of a LPF, the frequency deviation can be removed without reduction of a portion of signal power.

According to the present invention, the oscillator control unit controls a voltage controlled oscillator according to a frequency deviation detected by the frequency deviation estimating unit. Therefore, even when a frequency deviation is larger as compared to a cutoff frequency of a LPF, the frequency deviation can be removed without reduction of a portion of signal power.

According to the present invention, the oscillator control unit or phase rotating unit is switched according to a frequency deviation detected by the frequency deviation estimating unit. Therefore, even when a frequency deviation is large at the time of capturing a signal in an initial stage, the frequency deviation can be removed without reduction of a portion of signal power by means of a cutoff frequency of a LPF. In addition, with the present invention, switching control of a frequency deviation is executed according to information for frequency deviation from the phase difference computing unit, therefore an optimal removal of frequency deviation according to the information for the frequency deviation can be made.

As described above, the automatic frequency control apparatus according to the present invention is useful in a field of mobile communications with quality of communications to be improved, especially suitable for a communication device used in an environment with a low CN where a frequency deviation can not be estimated for a short period of time or in a fading environment where a multi-path wave and a direct wave coexist.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An automatic frequency control apparatus comprising:
    a distortion detecting unit for detecting a fading distortion according to a known signal inserted into an incoming signal;
    a first phase difference estimating unit for estimating a phase difference in a prespecified first period from the fading distortion and outputting the estimated value as a first phase difference;
    a second phase difference estimating unit for estimating a phase difference in a prespecified second period different from the first period from the fading distortion and outputting the estimated value as a second phase difference;
    a phase difference computing unit for computing a phase difference in one symbol in the incoming signal according to the first phase difference and the second phase difference and outputting the computed value as a third phase difference;
    an integrating unit for executing integration processing for the third phase difference by means of iterative addition and outputting a phase signal as a result of the integration processing; and
    a phase rotating unit for rotating a phase of the incoming signal according to the phase signal.

2. The automatic frequency control apparatus according to claim 1; wherein known signals of $N_P$ symbols in series are periodically inserted into the incoming signal, and said distortion detecting unit further comprises a distortion averaging unit for executing average processing for a fading distortion detected for each known signal over the period of $N_P$ symbols and outputting a result of the average processing.

3. The automatic frequency control apparatus according to claim 1 further comprising a phase compensating unit for executing phase compensation for the incoming signal according to the first phase difference as well as to the distortion; wherein
    said first phase difference estimating unit estimates a phase difference in the first period as an interval that is an integral multiple of a known signal insertion interval and outputs the estimated value as the first phase difference, and
    said second phase difference estimating unit estimates a phase difference still remaining after the phase compensation in the second period as an interval that is an integral multiple of a known signal insertion interval and is longer than the first period, and outputs the estimated value as the second phase difference.

4. The automatic frequency control apparatus according to claim 1 further comprising a phase compensating unit for executing phase compensation for the incoming signal according to the first phase difference and the distortion; wherein
    said first phase difference estimating unit estimates a phase difference in the first period as an interval between adjacent known signals and outputs the estimated value as the first phase difference, and
    said second phase difference estimating unit estimates a phase difference still remaining after the phase compensation in the second period as an interval that is an integral multiple of a known signal insertion interval and outputs the estimated value as the second phase difference.

5. The automatic frequency control apparatus according to claim 1; wherein
said first phase difference estimating unit estimates a phase difference in the first period as an interval that is an integral multiple of a known signal insertion interval and outputs the estimated value as the first phase difference, and
said second phase difference estimating unit estimates a phase difference in the second period as an interval that is an integral multiple of a known signal insertion interval and is longer than the first period, and outputs the estimated value as the second phase difference.

6. The automatic frequency control apparatus according to claim 5; wherein said phase difference computing unit comprises:
a phase difference selecting unit for selecting either the first phase difference or the second phase difference; and
an inter-symbol phase difference computing unit for computing a phase difference in one symbol in the incoming signal according to the selected phase difference and outputting a computed value as the third phase difference.

7. The automatic frequency control apparatus according to claim 5; wherein said phase difference computing unit comprises:
a first inter-symbol phase difference computing unit for computing a phase difference in one symbol in the incoming signal according to the first phase difference and outputting a computed value as a fourth phase difference;
a second inter-symbol phase difference computing unit for computing a phase difference in one symbol in the incoming signal according to the second phase difference and outputting a computed value as the fifth phase difference; and
a phase difference selecting unit for selecting either the fourth phase difference or the fifth phase difference and outputting a result of the selection as the third phase difference.

8. The automatic frequency control apparatus according to claim 1; wherein
said first phase difference estimating unit estimates a phase difference in the first period as an interval between adjacent known signals and outputs the estimated value as the first phase difference, and
said second phase difference estimating unit estimates a phase difference in the second period as an interval that is an integral multiple of a known signal intersection interval and outputs the estimated value as the second phase difference.

9. The automatic frequency control apparatus according to claim 8; wherein said phase difference computing unit comprises:
a phase difference selecting unit for selecting either the first phase difference or the second phase difference; and
an inter-symbol phase difference computing unit for computing a phase difference in one symbol in the incoming signal according to the selected phase difference and outputting a computed value as the third phase difference.

10. The automatic frequency control apparatus according to claim 8; wherein said phase difference computing unit comprises:
a first inter-symbol phase difference computing unit for computing a phase difference in one symbol in the incoming signal according to the first phase difference and outputting a computed value as the fourth phase difference;
a second inter-symbol phase difference computing unit for computing a phase difference in one symbol in the incoming signal according to the second phase difference and outputting a computed value as the fifth phase difference; and
a phase difference selecting unit for selecting either the fourth phase difference or the fifth phase difference and outputting a result of the selection as the third phase difference.

11. The automatic frequency control apparatus according to claim 1; wherein each of said first phase difference estimating unit and second phase difference estimating unit averages the phase differences in a burst respectively, and further performs weighted average of the phase difference over bursts.

12. The automatic frequency control apparatus according to claim 1; wherein said phase difference computing unit further performs, after computation of a phase difference in one symbol, average processing of phase differences over symbols and outputs a result of the averaging as the third phase difference.

13. The automatic frequency control apparatus according to claim 1 further comprising:
a baseband signal output unit for outputting analog baseband signals in an I-channel and a Q-channel from the incoming signal as well as from a sinusoidal signal outputted by an oscillator;
an analog-to-digital converting unit for generating a digital baseband signal from the analog baseband signals; and
a waveform shaping unit for executing waveform shaping to the digital baseband signal by means of filtering processing and outputting the waveform-shaped signal to said distortion detecting unit.

14. The automatic frequency control apparatus according to claim 13; wherein said phase rotating unit is located in a previous stage of the stage where waveform shaping is executed to the digital baseband signal by the waveform shaping unit; and
said waveform shaping unit executes waveform shaping to the digital baseband signal after phase rotation and outputs the waveform-shaped signal to said distortion detecting unit.

15. An automatic frequency control apparatus comprising:
a baseband signal output unit for outputting analog baseband signals in an I-channel and a Q-channel from the incoming signal as well as from a sinusoidal signal outputted by a voltage controlled oscillator;
an analog-to-digital converting unit for generating a digital baseband signal from the analog baseband signals;
a waveform shaping unit for executing waveform shaping to the digital baseband signal by means of filtering processing;
a distortion detecting unit for detecting a fading distortion according to a known signal within the waveform-shaped digital baseband signal;
a first phase difference estimating unit for estimating a phase difference in a prespecified first period from the fading distortion and outputting the estimated value as a first phase difference;
a second phase difference estimating unit for estimating a phase difference in a prespecified second period different from the first period from the fading distortion and outputting the estimated value as a second phase difference;

a phase difference computing unit for computing a phase difference in one symbol in the incoming signal according to the first phase difference and the second phase difference and outputting a computed value as a third phase difference; and an oscillator control unit for controlling a phase of the incoming signal by computing a control signal to control said voltage controlled oscillator according to the third phase difference.

16. The automatic frequency control apparatus according to claim 15 further comprising:

an integrating unit for executing integration processing for the third phase difference by means of iterative addition and outputting a phase signal as a result of the integration processing;

a phase rotating unit for rotating a phase of the incoming signal according to the phase signal; and a frequency deviation control unit capable of controlling switching to rotation of a phase of the incoming signal by said phase rotating unit or to control of a phase thereof by said oscillator control unit according to the third phase difference.

* * * * *